US011778823B2

(12) United States Patent
Yeh et al.

(10) Patent No.: US 11,778,823 B2
(45) Date of Patent: Oct. 3, 2023

(54) THREE-DIMENSIONAL MEMORY DEVICE AND METHOD FOR MANUFACTURING THE SAME

(71) Applicant: MACRONIX International Co., Ltd., Hsinchu (TW)

(72) Inventors: Teng-Hao Yeh, Hsinchu County (TW); Hang-Ting Lue, Hsinchu (TW); Guan-Ru Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 315 days.

(21) Appl. No.: 17/125,407

(22) Filed: Dec. 17, 2020

(65) Prior Publication Data
US 2022/0199639 A1   Jun. 23, 2022

(51) Int. Cl.
*H10B 43/27* (2023.01)
*H10B 41/27* (2023.01)
(Continued)

(52) U.S. Cl.
CPC ............ *H10B 43/27* (2023.02); *H10B 41/27* (2023.02); *H10B 41/41* (2023.02); *H10B 43/40* (2023.02)

(58) Field of Classification Search
CPC ........ H10B 20/40; H10B 20/50; H10B 53/20; H10B 41/20; H10B 41/23; H10B 41/27;
(Continued)

(56) References Cited

U.S. PATENT DOCUMENTS

2018/0097118 A1   4/2018   Zhang
2019/0319044 A1*  10/2019  Harari ............... H01L 29/40117
(Continued)

FOREIGN PATENT DOCUMENTS

TW            202101679         1/2021

OTHER PUBLICATIONS

"Office Action of Taiwan Counterpart Application", dated Oct. 1, 2021, p. 1-p. 6.
(Continued)

*Primary Examiner* — Amar Movva
(74) *Attorney, Agent, or Firm* — J.C. PATENTS

(57) ABSTRACT

The present disclosure provides a three-dimensional memory device and a method for manufacturing the same. The three-dimensional memory device includes a plurality of tiles, and each tiles includes a plurality of blocks, and each blocks includes a gate stacked structure, a conductive layer, first ring-shaped channel pillars, source/drain pillars, and charge storage structures. The gate stacked structure is disposed on the substrate and includes gate layers electrically insulated from each other. The conductive layer is disposed between the substrate and the gate stacked structure. The first ring-shaped channel pillars are disposed on the substrate and located in the gate stacked structure. The source/drain pillars are disposed on the substrate, and each of the first ring-shaped channel pillars are configured with two source/drain pillars disposed therein. Each of the charge storage structures is disposed between the corresponding gate layer and the corresponding first ring-shaped channel pillar. The conductive layer in one of the tiles is isolated from the conductive layers in the other tiles.

10 Claims, 21 Drawing Sheets

(51) Int. Cl.
*H10B 41/41* (2023.01)
*H10B 43/40* (2023.01)

(58) Field of Classification Search
CPC ........ H10B 43/20; H10B 43/23; H10B 43/27;
H10B 51/20; H10B 63/84; H10B 63/845;
H10B 53/30; H10B 41/30; H10B 41/35;
H10B 43/30; H10B 43/35; H10B 51/30;
H01L 27/11273; H01L 27/1128; H01L
27/11514; H01L 27/11551; H01L
27/11553; H01L 27/11556; H01L
27/11578; H01L 27/1158; H01L
27/11582; H01L 27/11597; H01L
27/2481; H01L 27/249; H01L 27/11507;
H01L 27/11521; H01L 27/11524; H01L
27/11568; H01L 27/1157; H01L 27/1159
See application file for complete search history.

(56) References Cited

U.S. PATENT DOCUMENTS

2020/0066744 A1 2/2020 Yun et al.
2020/0381450 A1 12/2020 Lue et al.

OTHER PUBLICATIONS

"Search Report of Europe Counterpart Application", dated Jun. 21, 2021, pp. 1-7.

* cited by examiner

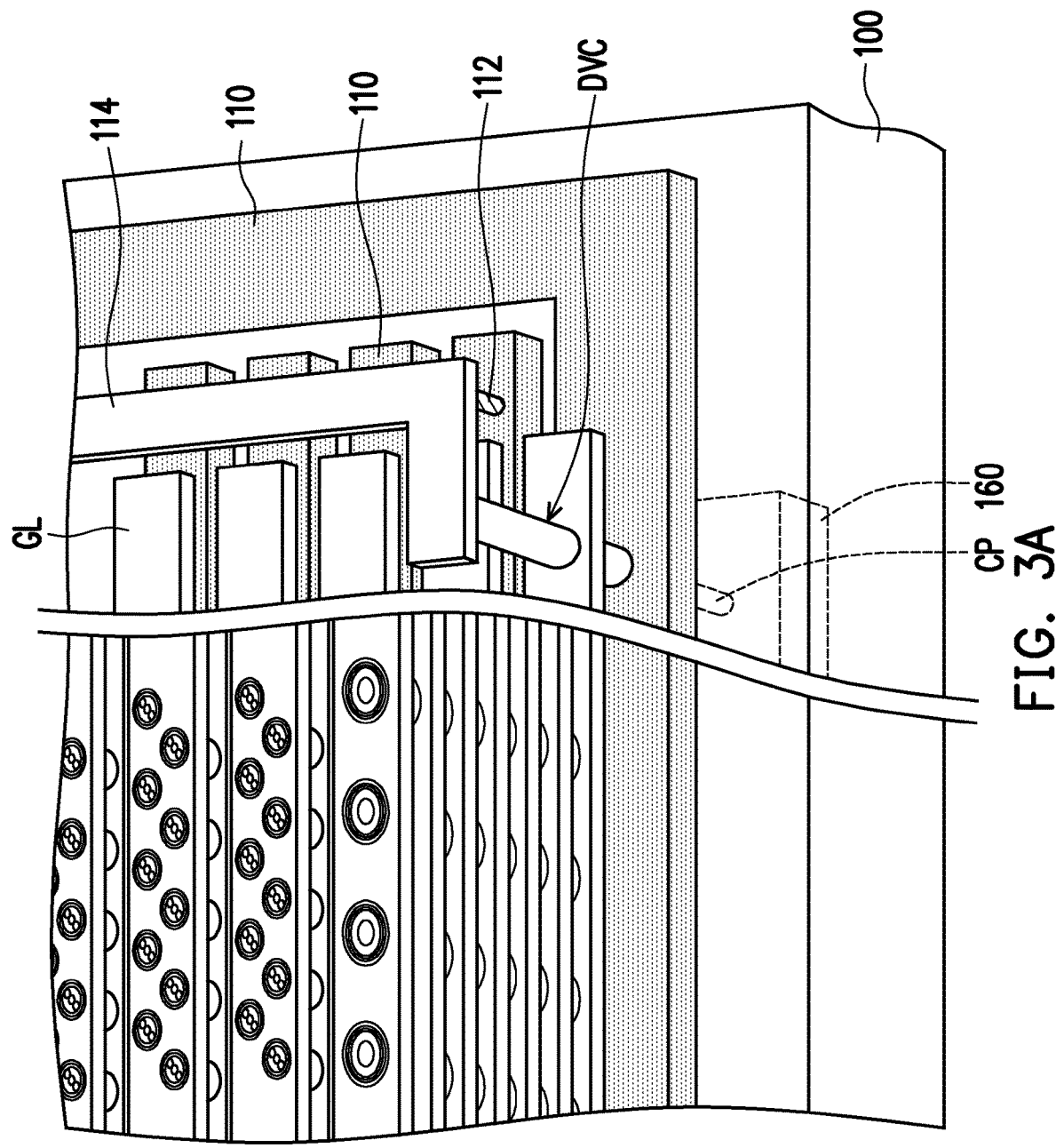

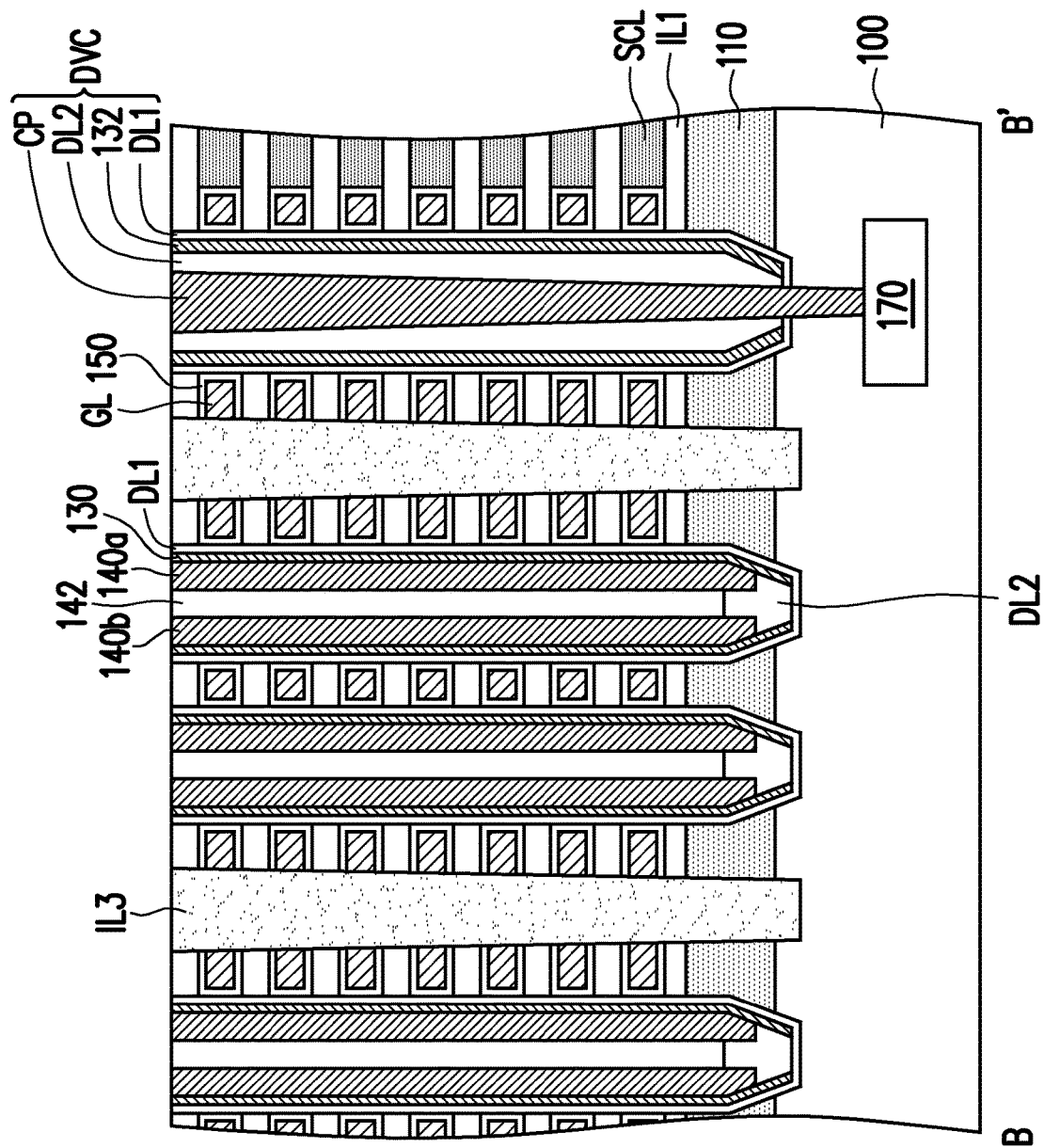

THREE-DIMENSIONAL MEMORY DEVICE AND METHOD FOR MANUFACTURING THE SAME

BACKGROUND OF THE INVENTION

1. Field of the Invention

The invention is related to a semiconductor device and a method for manufacturing the same, and more generally to a three-dimensional memory device and a method for manufacturing the same.

2. Description of Related Art

A non-volatile memory is widely used in personal computers and other electronic devices because it has an advantage that the stored data does not disappear after being powered off. The three-dimensional memory currently used in the industry includes a NOR type memory and a NAND type memory. In addition, another type of three-dimensional memory is an AND type memory, which can be applied to a multi-dimensional memory array with high integration and high area utilization, and has an advantage of fast operation speed. Therefore, the development of a three-dimensional memory has gradually become the current trend.

SUMMARY OF THE INVENTION

The present invention provides a three-dimensional memory device, in which the conductive layer in one of the memory tiles is designed to isolate from the conductive layer in another one of the memory tiles, so that the bias applied to the conductive layer can be well controlled.

An embodiment of the present invention provides a three-dimensional memory device including a plurality of tiles, and each tiles includes a plurality of blocks, and each blocks includes a gate stacked structure, a conductive layer, first ring-shaped channel pillars, source/drain pillars, and charge storage structures. The gate stacked structure is disposed on the substrate and includes gate layers electrically insulated from each other. The conductive layer is disposed between the substrate and the gate stacked structure. The first ring-shaped channel pillars are disposed on the substrate and located in the gate stacked structure. The source/drain pillars are disposed on the substrate, and each of the first ring-shaped channel pillars are configured with two source/drain pillars disposed therein. Each of the charge storage structures is disposed between the corresponding gate layer and the corresponding first ring-shaped channel pillar. The conductive layer in one of the tiles is isolated from the conductive layers in the other tiles.

According to an embodiment of the present invention, the conductive layers in two adjacent tiles are spaced apart from each other.

According to an embodiment of the present invention, the conductive layers of the plurality of blocks within the tile are spaced apart from each other.

According to an embodiment of the present invention, the conductive layers of the plurality of blocks within the tile are electrically connected with each other.

According to an embodiment of the present invention, the conductive layers of the plurality of the blocks within the tile are integrally connected together.

According to an embodiment of the present invention, the three-dimensional memory device further includes a plurality of dummy gate stacked structures disposed on the substrate and respectively configured at two opposite sides of each tiles in an arrangement direction of the plurality of blocks.

According to an embodiment of the present invention, the three-dimensional memory device further includes a plurality of dummy channel pillars respectively disposed in the corresponding dummy gate stacked structure and extended into the substrate, wherein each of the plurality of dummy channel pillars includes a second ring-shaped channel pillar and a conductive pillar located in the second ring-shaped channel pillar, and at least one of the conductive layers are connected to a driver located in the substrate through the corresponding conductive pillar.

According to an embodiment of the present invention, the plurality of the first ring-shaped channel pillars and the plurality of source/drain pillars extend into the conductive layers to constitute a plurality of bottom parasitic transistors in the conductive layers.

According to an embodiment of the present invention, the plurality of bottom parasitic transistors retain off-state.

According to an embodiment of the present invention, the three-dimensional memory device further includes an insulation pillar disposed between the two source/drain pillars.

An embodiment of the present invention provides a method for manufacturing a three-dimensional memory device. The method includes following steps. A conductive material layer is formed on a substrate. A stacked structure including a plurality of insulation material layers and a plurality of sacrificed material layer alternatively stacked with each other on the substrate is formed on the conductive material layer. A plurality of first ring-shaped channel pillars are formed in the stacked structure. A plurality of source/drain pillars are formed in the stacked structure, and each of the plurality of first ring-shaped channel pillars are configured with two source/drain pillars disposed therein. A patterning process is performed on the stacked structure to form a plurality of first trenches penetrating through the stacked structure and the conductive material layer, wherein the plurality of first trenches define a plurality of patterned stacked structures and a plurality of conductive layers located between the substrate and the plurality of patterned stacked structures, and each of the plurality of patterned stacked structures includes a plurality of insulation layers and a plurality of sacrificed layers alternatively stacked with each other on the substrate. The plurality of sacrificed layers are removed to form a horizontal opening between two adjacent insulation layers. A charge storage structure and a gate layer are formed in the horizontal opening sequentially, wherein the charge storage structure is formed between the gate layer and the corresponding first ring-shaped channel pillar.

According to an embodiment of the present invention, the plurality of first trenches define a plurality of tiles and a plurality of blocks including in each of the tiles, wherein each of the blocks includes the patterned stacked structure and the conductive layer, and the conductive layers of the plurality of blocks within the tile are spaced apart from each other.

According to an embodiment of the present invention, the conductive material layers of the plurality of blocks within the tile are electrically connected to each other.

According to an embodiment of the present invention, the plurality of first trenches define a plurality of tiles, and each of the tiles include a plurality of the patterned stacked structures and the conductive layer, and a second trenches are formed between the adjacent two patterned stacked structure to define a plurality of blocks on the conductive layer.

According to an embodiment of the present invention, the method further includes forming a dummy channel pillar in the patterned stacked structure and the conductive layer, wherein the dummy channel pillar includes a second ring-shaped channel pillar and a conductive pillar in the second ring-shaped channel pillar.

According to an embodiment of the present invention, at least one of conductive layers is connected with a driver located in the substrate through the conductive pillar.

According to an embodiment of the present invention, the gate layer or the source/drain pillar is connected with an active device located in the substrate through the conductive pillar.

According to an embodiment of the present invention, the plurality of the first ring-shaped channel pillars and the plurality of source/drain pillars extend into the corresponding conductive layer respectively, so as to form a plurality of bottom parasitic transistors in the corresponding conductive layers.

According to an embodiment of the present invention, the plurality of bottom parasitic transistors retain off-state.

According to an embodiment of the present invention, the method further includes forming an insulation pillar between the two source/drain pillars.

In view of the above, in the three-dimensional memory device of the present invention, the conductive layer in one of the tiles is isolated from the conductive layers in the other tiles. As such, when a bias is applied on one of the conductive layers, the capacitances generated between the other conductive layers and the corresponding gate layers in the other tiles can be omitted and thus the bias applied to the conductive layer can be well controlled.

To make the features and advantages of the invention clear and easy to understand, the following gives a detailed description of embodiments with reference to accompanying drawings.

BRIEF DESCRIPTION OF THE DRAWINGS

FIG. 3A is a schematic perspective view of the area C in FIG. 1 observed through an angle of view.

FIG. 5A to FIG. 5H illustrate a manufacturing process of a three-dimensional memory device according to an embodiment of the present invention, wherein FIG. 5A to FIG. 5H are schematic cross-sectional views taken along from line A-A' of FIG. 1.

FIG. 6A to FIG. 6H illustrate a manufacturing process of a three-dimensional memory device according to an embodiment of the present invention, wherein FIG. 6A to FIG. 6H are schematic cross-sectional views taken along from line B-B' of FIG. 1.

DESCRIPTION OF THE EMBODIMENTS

Figure 1:
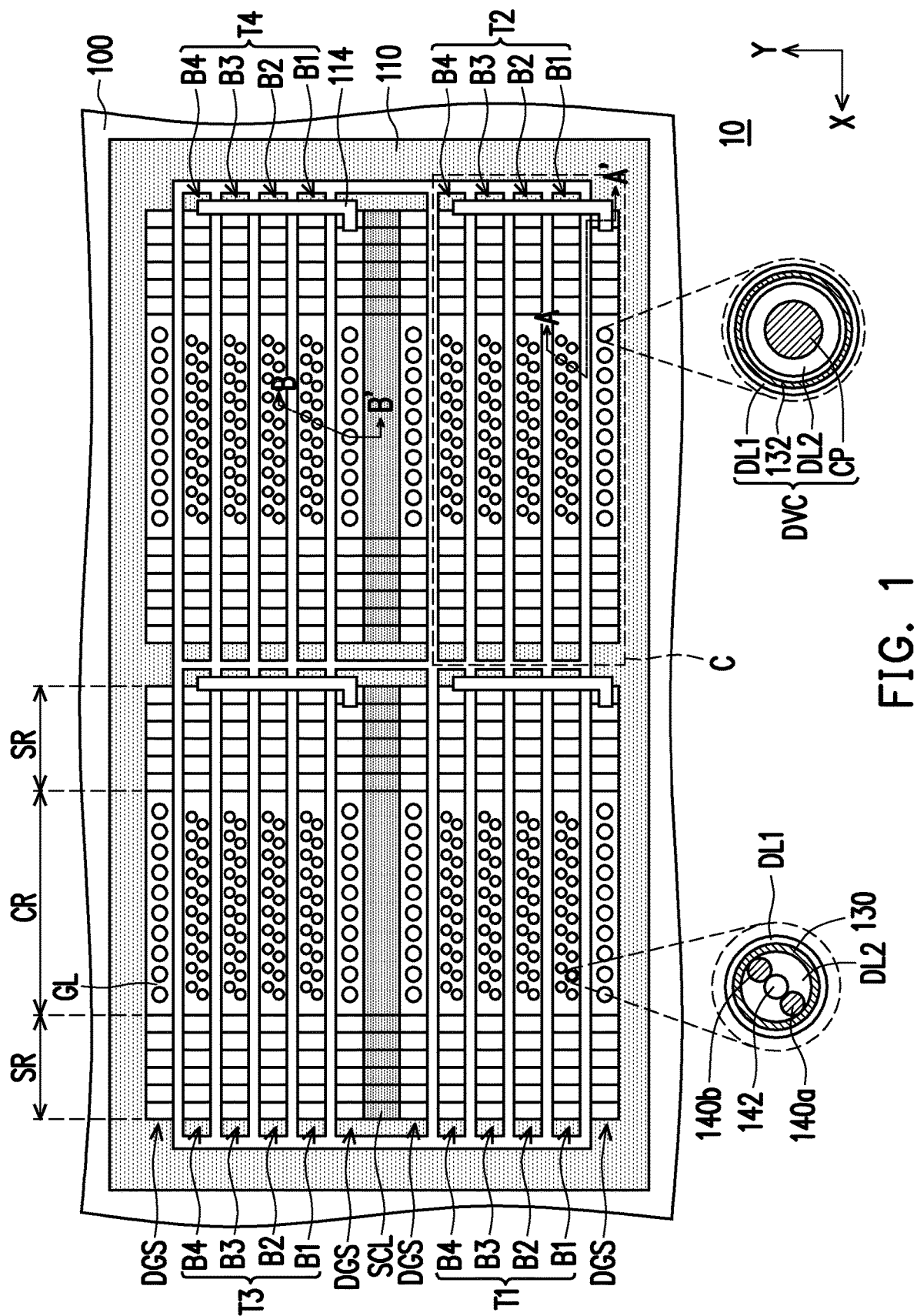
FIG. 1 is a schematic top view of a three-dimensional memory device according to an embodiment of the present invention.
Figure 2:
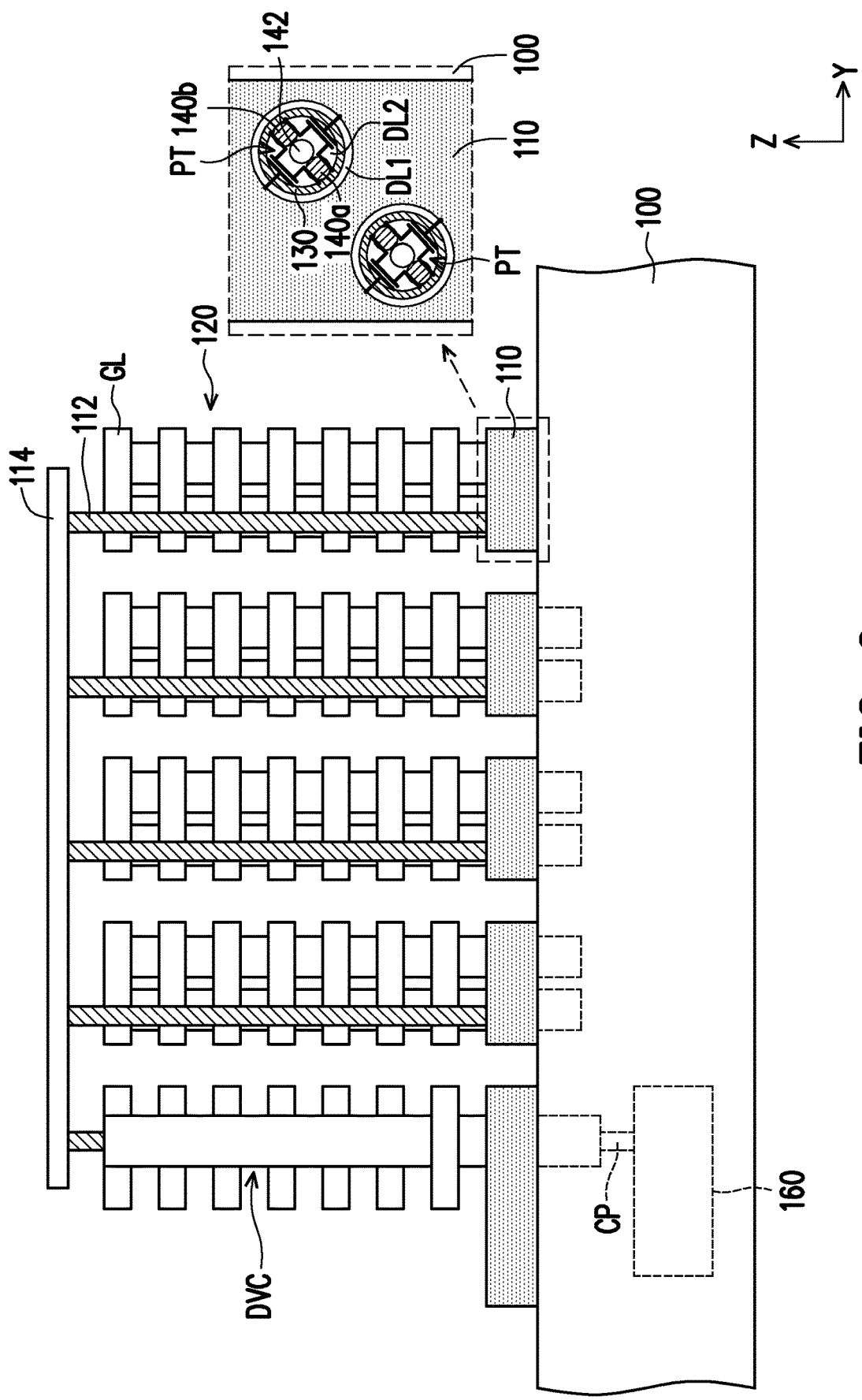
FIG. 2 is a schematic side view of an area C in FIG. 1.
Figure 3B:
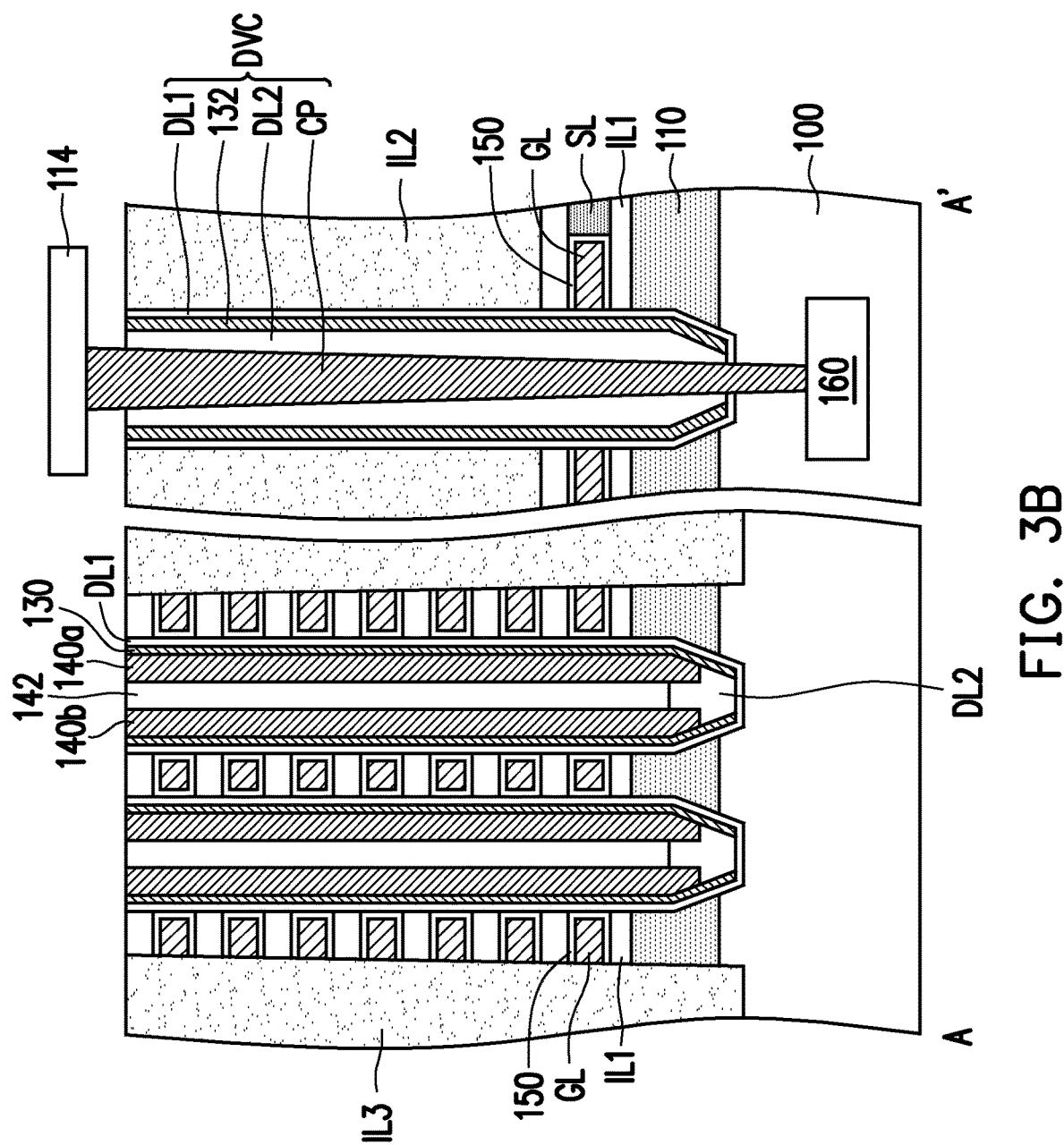
FIG. 3B is a schematic cross-sectional view taken along from line A-A' of FIG. 1.
Figure 4:
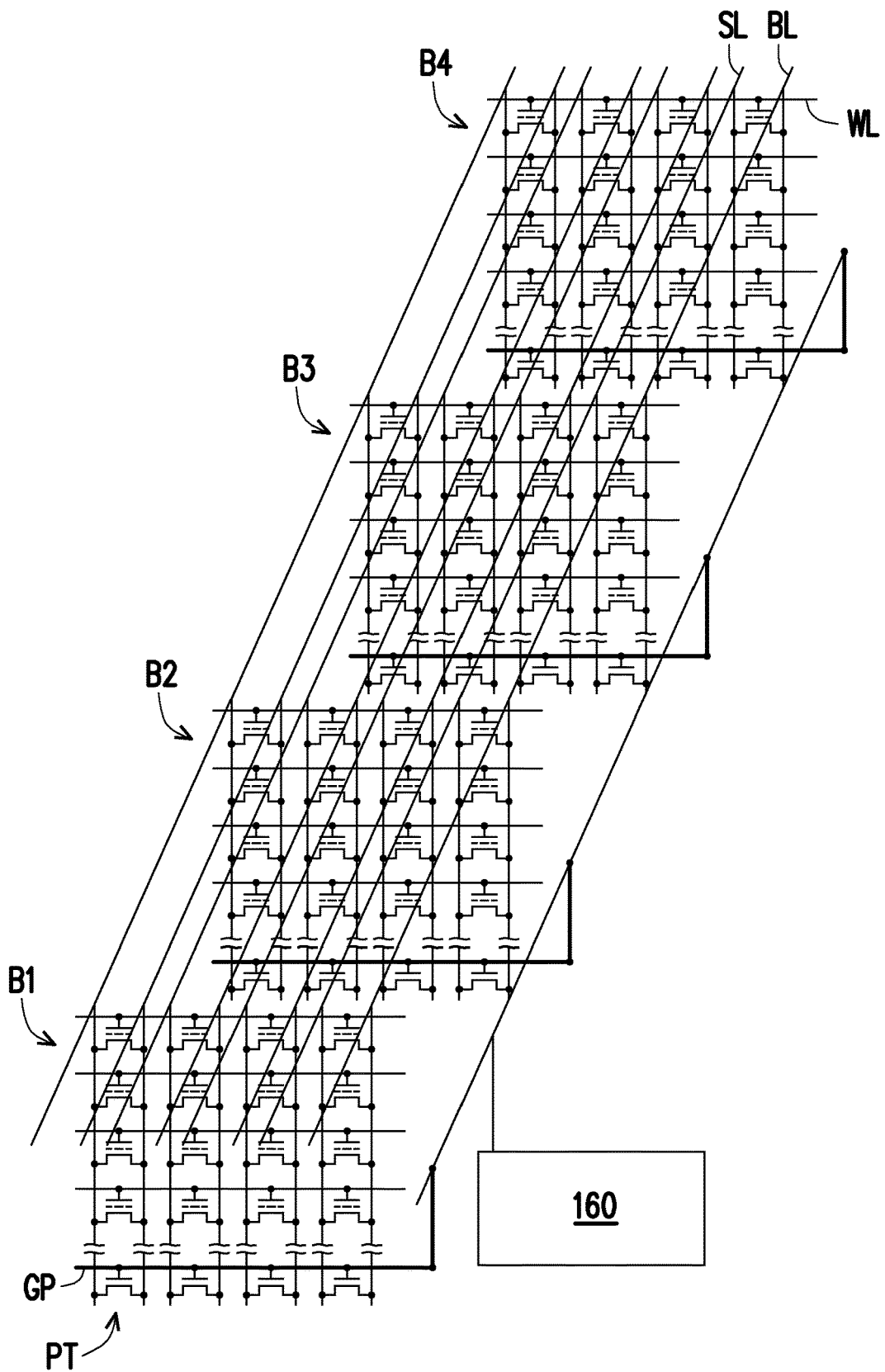
FIG. 4 is a schematic diagram of a circuit of one of tiles of a three-dimensional memory device according to an embodiment of the present invention.

FIG. 1 is a schematic top view of a three-dimensional memory device according to an embodiment of the present invention. For the convenience of explanation, FIG. 1 only shows a schematic top view of a substrate 100, conductive layers 110 and 114, gate layers GL of gate stacked structures, dielectric layers DL1 and DL2, channel pillars 130, source/drain pillars 140a and 140b are insulation pillar 142, dummy gate stacked structures DGS, and sacrificed layers SCL of patterned stacked structures to clearly understand the corresponding relationships between respective elements. FIG. 2 is a schematic side view of an area C in FIG. 1. For the convenience of explanation, a portion of FIG. 2 that squared in dash line illustrates a top view of a bottom parasitic transistor PT, so as to clearly understand the corresponding relationships between respective elements that constitute the bottom parasitic transistor PT. FIG. 3A is a schematic perspective view of the area C in FIG. 1 observed through an angle of view. FIG. 3B is a schematic cross-sectional view taken along from line A-A' of FIG. 1. FIG. 4 is a schematic diagram of a circuit of one of tiles of a three-dimensional memory device according to an embodiment of the present invention.

Referring to FIG. 1A to FIG. 4, a three-dimensional memory device 10 may include a plurality of tiles T1-T4. Each of the tiles T1-T4 may include a plurality of blocks B1-B4. Each of the blocks B1-B4 may include a conductive layer 110, a gate stacked structure 120, a plurality of ring-shaped channel pillars 130, a plurality of source/drain pillars 140a and 140b, and a plurality of charge storage structures 150 on a substrate 100. FIG. 1 is an exemplary embodiment showing four tiles T1-T4 and four blocks B1-B4 included in each tiles T1-T4, but the number of the tiles and the blocks included in each tiles of the three-dimensional memory device 10 is not limited thereto.

The conductive layer 110 may be disposed between the substrate 100 and the gate stacked structure 120. The substrate 100 may include a dielectric layer formed on a semiconductor substrate. That is, the substrate 100 may include elements such as inner layer dielectric layers and/or contacts, interlayer dielectric layers and/or a vias (e.g., interconnection structure), active device (devices such as PMOS, NMOS, CMOS, JFET, BJT, or diode). However, those elements are not shown in the drawing for the convenience of explanation. The material of the conductive layer 110 may include a P-type doped polysilicon.

The gate stacked structure 120 may be disposed on the substrate 100 and include a plurality of gate layers GL electrically insulated from each other. The gate stacked structure 120 may include a plurality of insulation layer IL1, and the gate layer GL is disposed between the two adjacent insulation layers ILL The gate stacked structure 120 may include a cell region CR and staircase regions SR. In some embodiments, the staircase regions SR are configured at two opposite sides of the cell region CR. In some embodiments, the gate layers may be connected with word lines (as shown in FIG. 4) through staircase contacts (not illustrated), respectively. The material of gate layers GL may include tungsten (W), cobalt (Co), aluminum (Al), tungsten silicide ($WSi_x$), or cobalt silicide ($CoSi_x$). The material of the insulation layer IL1 may include a silicon oxide.

The conductive layer 110 of at least one of the tiles T1-T4 can be isolated from the conductive layers 110 of the other tiles T1-T4. For example, one of the conductive layers 110 is structurally and electrically isolated from the other conductive layers 110 to form a close block. As such, when a bias is applied on one of the conductive layers, the capacitances generated between the other conductive layers 110 and the corresponding gate layers GL in the other tiles T1-T4 can be omitted and thus the bias applied to the conductive layer can be well controlled.

In some embodiments, the conductive layers 110 of the two adjacent tiles T1-T4 are spaced apart from each other. In some embodiments, the conductive layer 110 of at least one of the blocks B1-B4 within the tiles T1-T4 is spaced apart from the conductive layers 110 of the other blocks B1-B4. In some embodiments, the conductive layers 110 of the blocks B1-B4 within the tiles T1-T4 are spaced apart from each other. In some other embodiments, the conductive layers 110 of the blocks B1-B4 within the tiles T1-T4 are connected with each other or integrated together to form a bulk conductive layer, and the bulk conductive layer of each tiles T1-T4 are spaced apart from each other.

In some embodiments, the conductive layer 110 of at least one of tiles T1-T4 is electrically isolated from the conductive layers 110 of the other tiles T1-T4. In some embodiments, the conductive layers 110 between the two adjacent blocks B1-B4 within the tiles T1-T4 are electrically isolated from each other, but the invention is not limited thereto. In some other embodiments, the conductive layers 110 between the two adjacent blocks B1-B4 within the tiles T1-T4 are electrically connected with each other, so as to save spaces occupied by drivers configured to apply a bias to the conductive layers 110.

The ring-shaped channel pillars 130 may be disposed on the substrate 100 and located in the gate stacked structure 120. The channel pillars 130 may be configured in the cell region CR of the gate stacked structure 120. The channel pillars 130 in the cell region CR of each gate stacked structures 120 can be configured as a plural. In some embodiments, the channel pillars may penetrate through the gate stacked structure 120 and a conductive layer 110 and extend into the substrate 100. Since the conductive layer 110 of at least one of tiles T1-T4 is isolated from the conductive layer 110 of the other tiles T1-T4, the capacitances generated between the conductive layers 110 and the channel pillars 130 in the other tiles T1-T4 can be omitted when applying a bias to the conductive layer 110. As such, the bias applied to the conductive layer can be well controlled.

In some embodiments, the channel pillars 130 are continuous in an extension direction thereof (e.g., a direction perpendicular to the substrate 100). In other words, the channel pillars 130 are integral in the extension direction thereof, and it is not divided into multiple disconnected parts. In some embodiments, the channel pillars 130 may have a circular profile when viewed from the top, but the invention is not limited thereto. In some other embodiments, the channel pillars 130 may have other profiles (e.g., polygonal shape) when viewed from the top. In some embodiments, the diameter size of the channel pillars 130 in the substrate 100 may be smaller than the diameter size of the channel pillars 130 in the gate stacked structure 120. In some embodiments, the diameter size of the channel pillars 130 in the conductive layer 110 may be gradually decreased from a portion of the conductive layer 110 adjacent to the substrate 100 toward the substrate 100. The material of the channel pillars 130 may be a semiconductor material, such as undoped polysilicon.

In some embodiments, dielectric layers DL1 may be provided between the channel pillars 130 and the gate stack structures 120. In some embodiments, the dielectric layers DL1 may extend into the conductive layers 110. In some embodiments, the dielectric layers DL1 may penetrate through the conductive layers 110 and be located in the substrate 100. In some embodiments, the dielectric layers DL1 between the channel pillars 130 and the gate layer GL can be used as a tunneling dielectric layer. The material of the dielectric layer DL1 may include silicon oxide.

The source/drain pillars 140a and 140b may be disposed on the substrate 100 and penetrate the gate stacked structure 120, wherein each of the ring-shaped channel pillars 130 is configured with two source/drain pillars 140a and 140b disposed therein. As such, the three-dimensional memory device 10 may proceed a 1-bit operation or a 2-bit operation according to different operation methods. For example, since the source/drain pillars 140a and 140b are connected with the channel pillars 130, an electron may be transmitted along the channel pillars 130 and stored in the entire charge storage structures 150 when applying a voltage on the source/drain pillars 140a and 140b. As such, the 1-bit operation may be performed on the three-dimensional memory device 10. In addition, regarding an operation by using a Fowler-Nordheim tunnelling, a source side injection, a channel-hot-electron injection or a band-to-band tunnelling hot carrier injection, an electron or a hole may be locally trapped in the charge storage structure 150 adjacent to one of the source/drain pillars 140a and 140b. As such, a single level cell (SLC, 1 bit) or a multi-level cell (MLC, >2 bits) operation may be performed on the three-dimensional memory device 10. The source/drain pillars 140a and 140b may be connected to the source line SL/bit line BL (as shown in FIG. 4) through other conductive layers. The material of the source/drain pillars 140a and 140b may include doped polysilicon.

In some embodiments, the source/drain pillars 140a and 140b may extend into the conductive layers 110, so that the source/drain pillars 140a and 140b and the channel pillars 130 extended into the conductive layers 110 may constitute bottom parasitic transistors PT with the conductive layers 110. As such, the bottom ends of the two source/drain pillars 140a and 140b are not prone to occur a current leakage. For example, the conductive layer 110 may be used as a gate of the bottom parasitic transistor PT (gate line GP as shown in FIG. 4); the dielectric layer DL1 extended into the conductive layer 110 may be used as a gate dielectric layer of the bottom parasitic transistor PT; the channel pillar 130 extended into the conductive layer 110 may be used as a channel layer of the bottom parasitic transistor PT; and the source/drain pillars 140a and 140b extended into the conductive layer 110 may be used as a source and a drain of the bottom parasitic transistor PT, respectively. That is, the bottom parasitic transistor PT can be a gate-all-around (GAA) transistor. The bottom parasitic transistor may retain off-state. For example, the bottom parasitic transistor PT may be a transistor that retains off-state without applying a voltage (i.e., normally off), or a transistor that retains off-state when applying a voltage.

In some embodiments, the two source/drain pillars 140a and 140b configured in the channel pillar 130 may be disposed to be staggered with each other. For example, an angle between the connection direction between the central points of the source/drain pillars 140a and 140b and the extending direction of the gate layer GL (e.g., X direction) is less than 90° (e.g., 45°). As such, a good process margin can be provided for the wires (such as the wires connected to the source line SL or the bit line BL) covering the source/drain pillars 140a and 140b. In addition, the source/drain pillars 140a and 140b with staggered configuration are beneficial to reduce the gate induce drain leakage (GIDL).

In some embodiments, the extension direction of the source/drain pillars 140a and 140b in the gate stacked structure 120 may be the same as the extension direction of the channel pillar 130, and the extension direction of the source/drain pillars 140a and 140b in the conductive layer 110 adjacent to the substrate 100 may be different from the extension direction of the channel pillar 130.

In some embodiments, an insulation pillar 142 may be provided between the two source/drain pillars 140a and 140b configured in the channel pillar 130 to space apart the two source/drain pillars 140a and 140b, so as to provide a good process margin to avoid an punch through phenomenon between the two source/drain pillars 140a and 140b. In some embodiments, the insulation pillar 142 may penetrate through the gate stacked structure 120 and may extend into the conductive layer 110. The material of the insulation pillar 142 may include silicon nitride.

The charge storage structure 150 may be disposed between each of the gate layers and the corresponding channel pillars 130. In some embodiments, the charge storage structure 150 may be an oxide-nitride-oxide (ONO) composite layer. The dielectric layer DL1 can be used as an oxide layer or a bandgap engineered tunneling oxide layer adjacent to the channel in the ONO composite layer, that is, the dielectric layer DL1 may be used as a tunneling dielectric layer constituted by a single oxide layer, or a tunneling dielectric layer constituted by an ONO composite layer (e.g., a tunneling composite layer portion in BE-SONOS). A charge storage layer (i.e., a nitride layer of the ONO composite layer) and a blocking layer (i.e., a oxide layer of the ONO composite layer adjacent to the gate layer GL) of the charge storage structure 150 may be located between the channel pillar 130 and the gate layer GL and between the gate layer GL and the insulation layer IL1.

In some embodiments, a buffer layer and a barrier layer may be disposed between the gate layer GL and the charge storage structure 150. The buffer layer is made of, for example, a material having a high dielectric constant that is greater than 7, such as aluminium oxide ($Al_2O_3$), hafnium oxide ($HfO_2$), lanthanum oxide ($La_2O_5$), transition metal oxide, lanthanide oxide, or a combination thereof. The barrier layer is made of, for example, titanium (Ti), titanium nitride (TiN), tantalum (Ta), tantalum nitride (TaN), or a combination thereof.

In some embodiments, the three-dimensional memory device 10 may further include a plurality of dummy channel pillars DVC. Dummy channel pillars DVC may refer to the channel pillars in which the source/drain pillars 140a and 140b are not configured therein. In some embodiments, the dummy channel pillars DVC may be disposed in the staircase region SR of the gate stacked structure 120, and the dummy channel pillars DVC may be penetrated through the gate stacked structure 120 and extended into the substrate 100, so as to connect signals of each gate layers GL in the gate stacked structure 120 to the active device located in the substrate 100. In some embodiments, the dummy channel pillar DVC may include a dielectric layer DL1, a ring-shaped channel pillar 132, a conductive pillar CP, and a dielectric layer DL2 between the ring-shaped channel pillar 132 and the conductive pillar CP. In some embodiments, the diameter size of the dummy channel pillar DVC is larger than that of the ring-shaped channel pillar 130. The material of the channel pillar 132 may include an undoped polysilicon. The material of the conductive pillar CP may include tungsten (W), cobalt (Co), aluminum (Al), tungsten silicide ($WSi_x$), or cobalt silicide ($CoSi_x$). The material of the dielectric layer DL2 may include a silicon oxide.

In some embodiments, the three-dimensional memory device 10 may further include a plurality of dummy gate stacked structures DGS disposed on the substrate and configured at two opposite sides of each tiles T1-T4 (e.g., two opposite sides of the tile T1-T4 in an arrangement direction of the blocks B1-B4). In some embodiments, the dummy channel pillars DVC may penetrate through the corresponding dummy gate stacked structures DGS, and the conductive layers 110 of each blocks B1-B4 may be connected to a driver 160 through the corresponding dummy channel pillars DVC. In some embodiments, the conductive layer 110 of each blocks B1-B4 may be connected to the same driver 160 through a wiring configuration of back-end-of-line (BEOL) process. For example, the conductive layers 110 of each blocks B1-B4 may be respectively connected to the same conductive layer 114 through conductive plugs 112 and the conductive layer 114 is connected to the dummy channel pillar DVC, so that the conductive layers 110 of each blocks B1-B4 may be connected to the same driver 160. However, the invention is not limited thereto. In some other embodiments, the conductive layers 110 of each blocks B1-B4 may be respectively connected to different drivers 160. In some embodiments, the dummy gate stacked structure DGS may be formed simultaneously with the gate stacked structures 120 in the same process.

In some embodiments, a insulation layer IL3 may be disposed between the two adjacent gate stacked structures 120 and/or between the gate stacked structure 120 and the dummy gate stacked structure DGS. The material of the insulation layer IL3 may include an organic insulation material, an inorganic insulation material, or a combination thereof.

Based on the above, the three-dimensional memory device 10 may be designed to be the conductive layer 110 in the at least one of tiles T1-T4 is isolated from the conductive layers 110 in the other tiles T1-T4, so that the capacitances between the conductive layers 110 and the gate layer GL and/or the capacitances between the conductive layers 110 and the channel pillars 130 in the other tiles T1-T4 can be omitted when applying a bias to the conductive layer 110. As such, the bias applied to the conductive layer 110 can be well controlled.

Hereinafter, a method for manufacturing the three-dimensional memory device will be illustrated by using FIGS. 5A to 5H, but the method for manufacturing the three-dimensional memory device of the present invention is not limited thereto. In addition, the same or similar components are represented by the same or similar reference numerals, and will not be repeated here.

FIG. 5A to FIG. 5H illustrate a manufacturing process of a three-dimensional memory device according to an embodiment of the present invention, wherein FIG. 5A to FIG. 5H are schematic cross-sectional views taken along from line A-A' of FIG. 1.

Figure 5A:
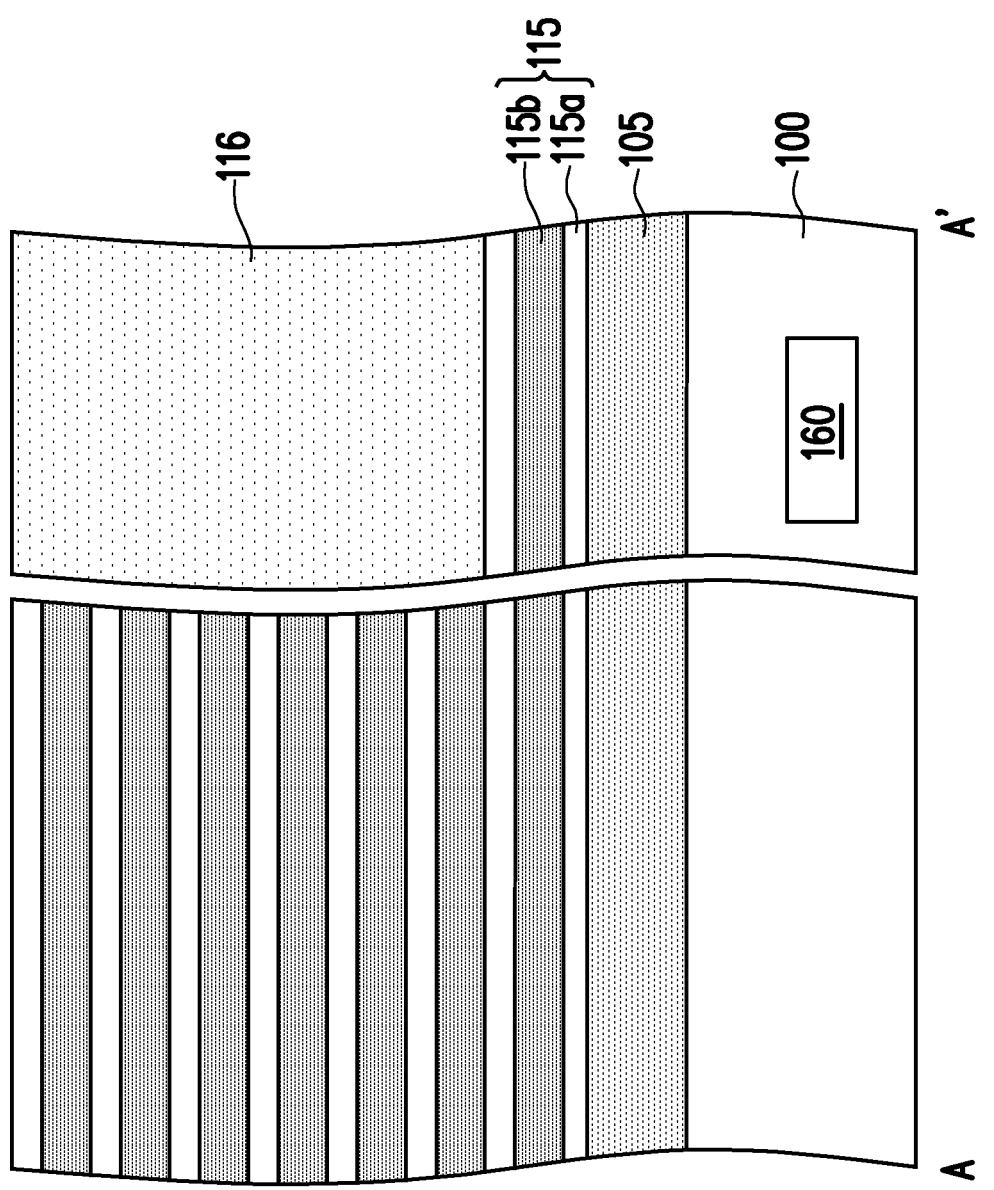

Referring to FIG. 5A, a conductive material layer 105 is formed on a substrate 100. The material of the conductive material layer 105 may include a doped polysilicon. In some embodiments, a driver 160 may be disposed in the substrate 100.

Then, a staircase-like stacked structure 115 is formed on the conductive material layer 105. In some embodiments, the stacked structure 115 may include a plurality of insulation material layers 115a and a plurality of sacrificed material layers 115b alternatively stacked on the conductive material layer 105. In some embodiments, the insulating material layer 115a may be a silicon oxide layer, and the sacrificed material layer 115b may be a silicon nitride layer.

Thereafter, an insulation material layer 116 covers the staircase-like stacked structure 115. The topmost surface of the insulation material layer 116 and the topmost surface of the staircase-like stacked structure 115 are coplanar. The material of the insulation material layer 116 may include an organic material, an inorganic material, or a combination thereof.

Figure 5B:
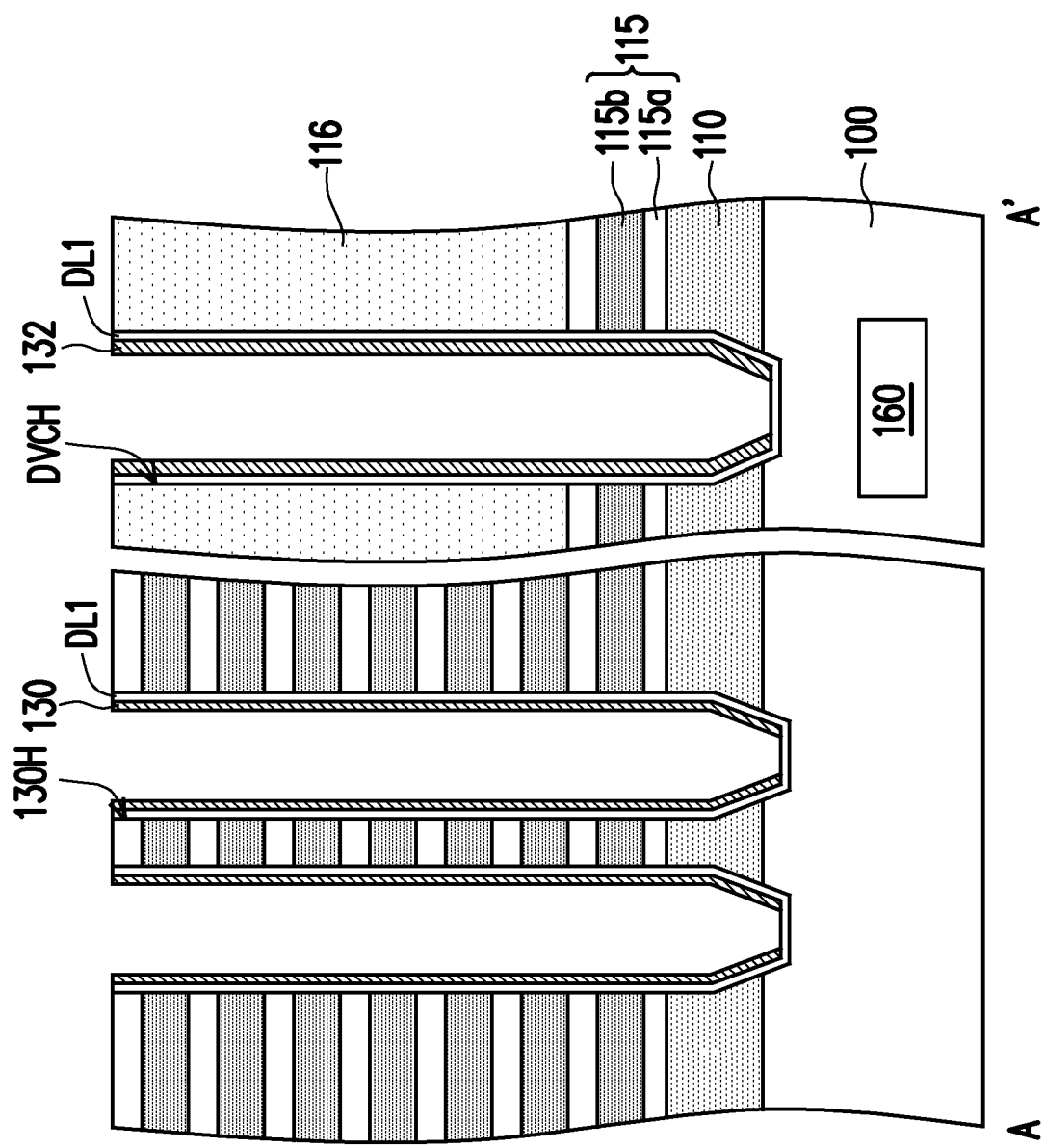

Referring to FIG. 5A and FIG. 5B, channel pillar openings 130H and dummy channel pillar openings DVCH are formed in the stacked structure 115. Next, dielectric layers DL1 and channel material layers (not shown) are sequentially formed on the sidewalls and the bottom of the channel pillar openings 130H and the dummy channel pillar openings DVCH. Then, the channel material layers at the bottom of the channel pillar openings 130H and the dummy channel pillar openings DVCH can be removed by etch back, so as to form channel pillars 130 and channel pillars 132. In some embodiments, the diameter size of the dummy channel pillar opening DVCH may be greater than that of the channel pillar opening 130H.

In some embodiments, in the process of removing the insulation material layer 115a and/or the sacrificed material layer 115b, the conductive material layer 105 can be used as an etching stop layer, so that the depth of the channel pillar openings 130H and the depth of the dummy channel pillar openings DVCH can be well controlled. For example, the channel pillar openings 130H and the dummy channel pillar openings DVCH may be removed by using an etching process to remove the insulation material layer 115a and the sacrificed material layer 115b on the conductive material layer 105, so as to form an opening exposed the conductive material layer 105. Then, another etching process may be used to remove the conductive material layer 105 exposed by the opening to form the channel pillar openings 130H and the dummy channel pillar openings DVCH exposed the substrate 100.

Figure 5C:
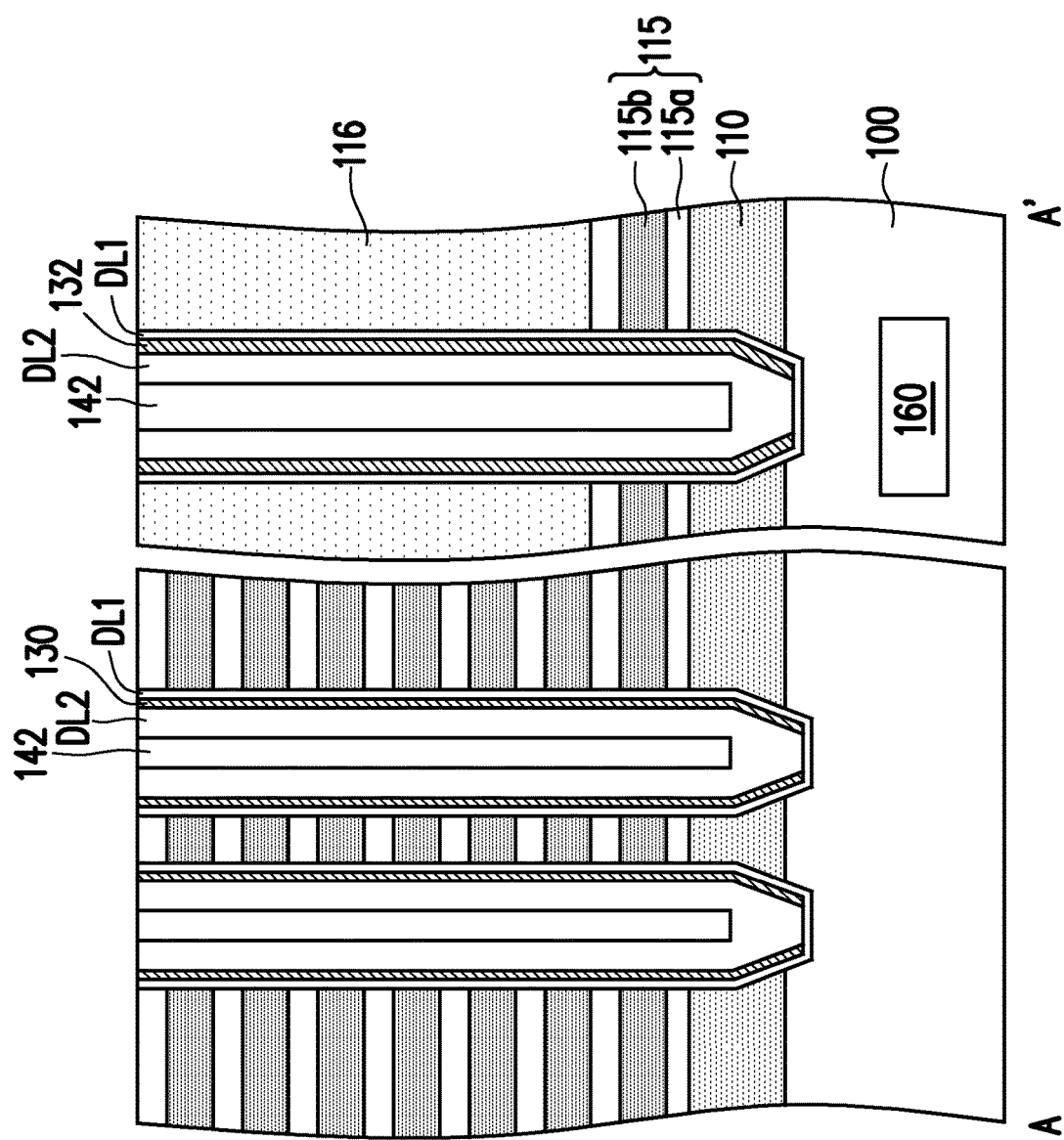

Referring to FIG. 5B and FIG. 5C, dielectric layers DL2 are formed on the sidewalls of the channel pillars 130 and 132 and on the dielectric layers DL1 exposed by the channel pillars 130 and 132, wherein the dielectric layer DL2 does not fill up the channel pillar openings 130H and the dummy channel pillar openings DVCH, and the central portion of the channel pillar openings 130H and the dummy channel pillar openings DVCH are retained. After that, an insulation material is filled in the central portion of the channel pillar openings 130H and the dummy channel pillar openings DVCH to form insulation pillars 142.

Figure 5D:
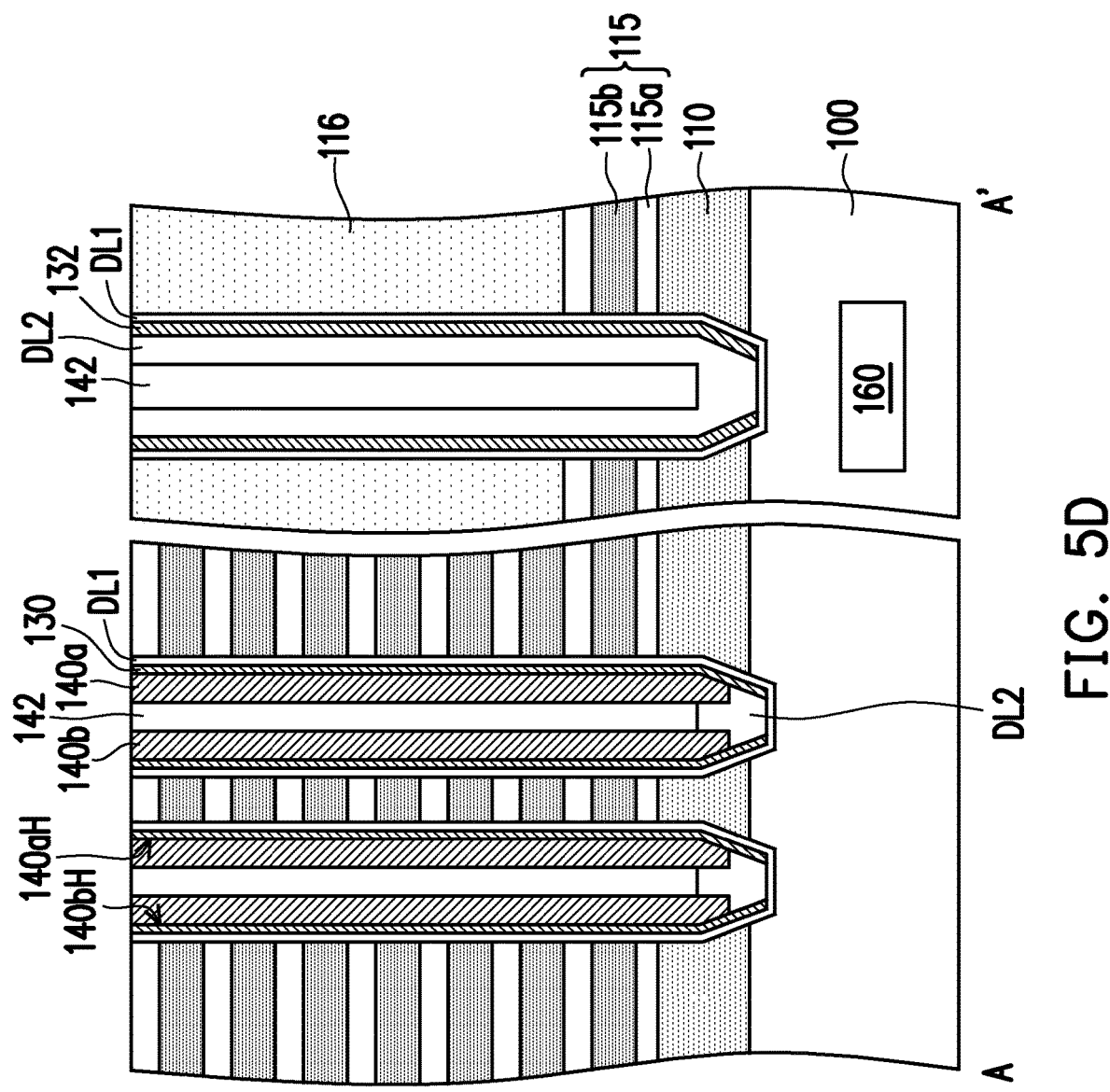

Referring to FIG. 5C and FIG. 5D, source/drain pillar openings 140aH and 140bH are formed in the dielectric layer DL2 at opposite sides of the insulation pillar 142 in the channel pillar 130. Then, the source/drain pillar openings 140aH and 140bH are filled with a material such as doped polysilicon to form source/drain pillars 140a and 140b. Each of the channel pillars 130 may be configured with two source/drain pillars 140a and 140b disposed therein.

Figure 5E:
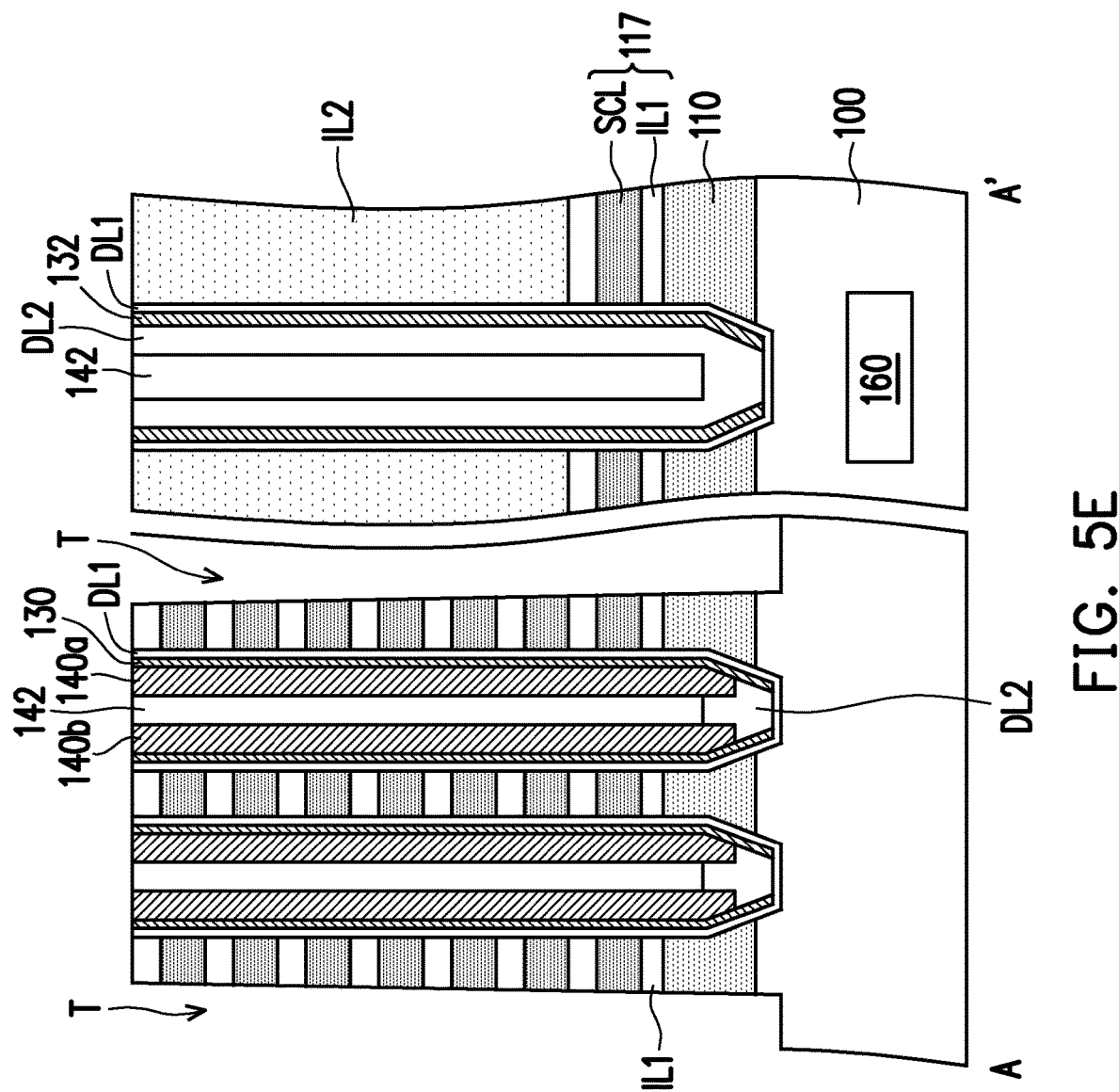

Referring to FIG. 5D and FIG. 5E, a patterning process is performed on the stacked structure 115 and a conductive material layer 105, so as to form a plurality of trenches T penetrating through the stacked structure 115 and the conductive material layer 105. The trenches T may divide the stacked structure 115 and the conductive material layer 105 into a plurality of patterned stacked structures 117 and a plurality of conductive layer 110, so as to define a plurality of tiles (e.g., tiles T1-T4 shown in FIG. 1) and a plurality of blocks (e.g., blocks B1-B4 shown in FIG. 1) in each of the tiles and to isolate the at least one of conductive layers 110 from the other conductive layers 110. Each of the patterned stacked structures 117 may include a plurality of insulation layer IL1 and a plurality of sacrificed layer SCL alternatively stacked on the substrate 100. The conductive layer 110 may be located between the substrate 100 and the plurality of patterned stacked structures 117. In some embodiments, a portion of the substrate 100 is also slightly removed during the above patterning process, so that the trenches T extend into the substrate 100. In some embodiments, a portion of the insulation material layer 116 is also removed to form the insulation layer IL2 during the above patterning process.

In some embodiments, the above patterning process includes following steps. Firstly, a first patterning process is performed on the stacked structure 115 by using the conductive material layer 105 as an etching stop layer, so as to form a plurality of patterned stacked structures 117 on the conductive material layer 105. Then, a second patterning process is performed on the conductive material layer 105, so as to form a plurality of conductive layers 110. The etch masks used in the first patterning process and the second patterning process may be the same as or different from each other, but the invention is not limited thereto.

In some embodiments, the plurality of trenches T may be integrated together to form a continuous trench T, but the invention is not limited thereto. In some other embodiments, the plurality of trenches T may be spaced apart from each other. In some embodiments, as shown in FIG. 1, the trenches T may be located between the two adjacent tiles T1-T4 and between the two adjacent blocks B1-B4. In some other embodiments, the trenches T for defining a plurality of tiles T1-T4 may penetrate through the stacked structure 115 and the conductive material layer 105; and the trenches (not illustrated) for defining a plurality of blocks B1-B4 in each tiles T1-T4 may penetrate through the stacked structure 115 and be disposed on the conductor layer 110. As such, the conductor layers 110 of the plurality of blocks B1-B4 within the tiles T1-T4 may be connected with each other or integrated together, so as to form a bulk conductive layer 110, and the bulk conductive layers 110 in each tiles T1-T4 may be spaced apart from each other.

Figure 5F:
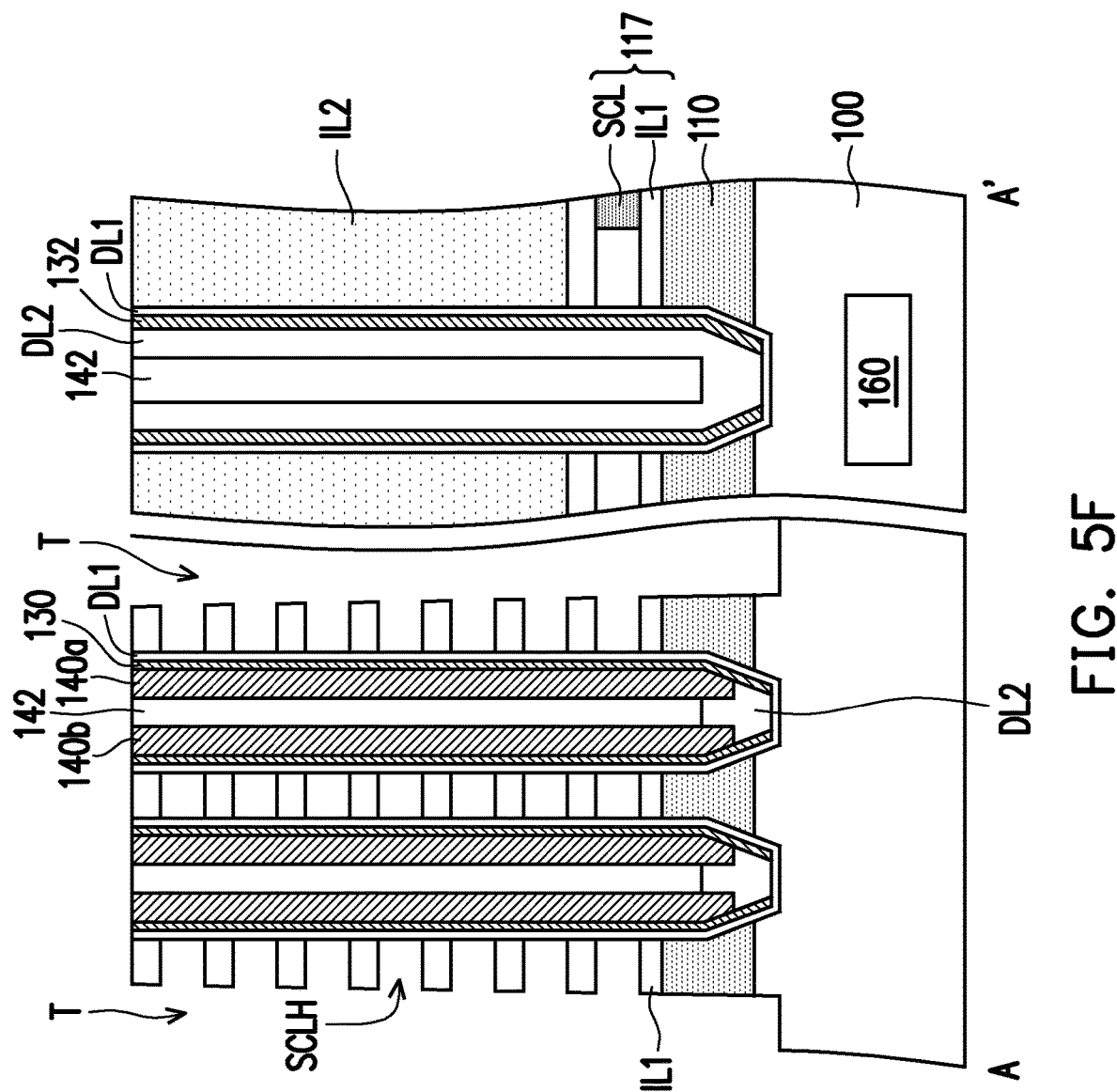

Referring to FIG. 5E and FIG. 5F, the sacrificed layer SCL in the patterned stacked structures 117 may be removed, so as to form horizontal openings SCLH between the adjacent two insulation layers IL1. In some embodiments, the trenches T may be connected with the horizontal openings SCLH. In some embodiments, the sacrificed layer SCL may be removed by hot phosphoric acid. In some embodiments, during a process of removing the sacrificed layers SCL in the patterned stacked structures 117, the channel pillars 130 in the cell regions CR and the dielectric layers DL2, the source/drain pillars 140a and 140b, and the insulation pillars 142 in the channel pillars 130 and the channel pillar 132 in the staircase regions SR and the dielectric layers DL2 and the insulation pillars 142 in the channel pillars 132 can be used as supporting pillars, so as to maintain the structural stability. It should be noticed that, the area of the sacrificed layers SCL removed by the hot phosphoric acid is limited, that is, the sacrificed layers SCL adjacent to the trenches T will be removed, but the sacrificed layers SCL far away from the trenches T will be retained. For example, as shown in FIG. 1, the patterned stacked structure 117 with unremoved sacrificed layers SCL is provided between the dummy gate stacked structure DGS at one side of the tile T1 and the dummy gate stacked structure DGS at another side of the tile T3. In other words, the dummy gate stacked structures DGS may be disposed at one side of the patterned stack structures 117 where the sacrificed layers SCL are not removed.

Figure 5G:
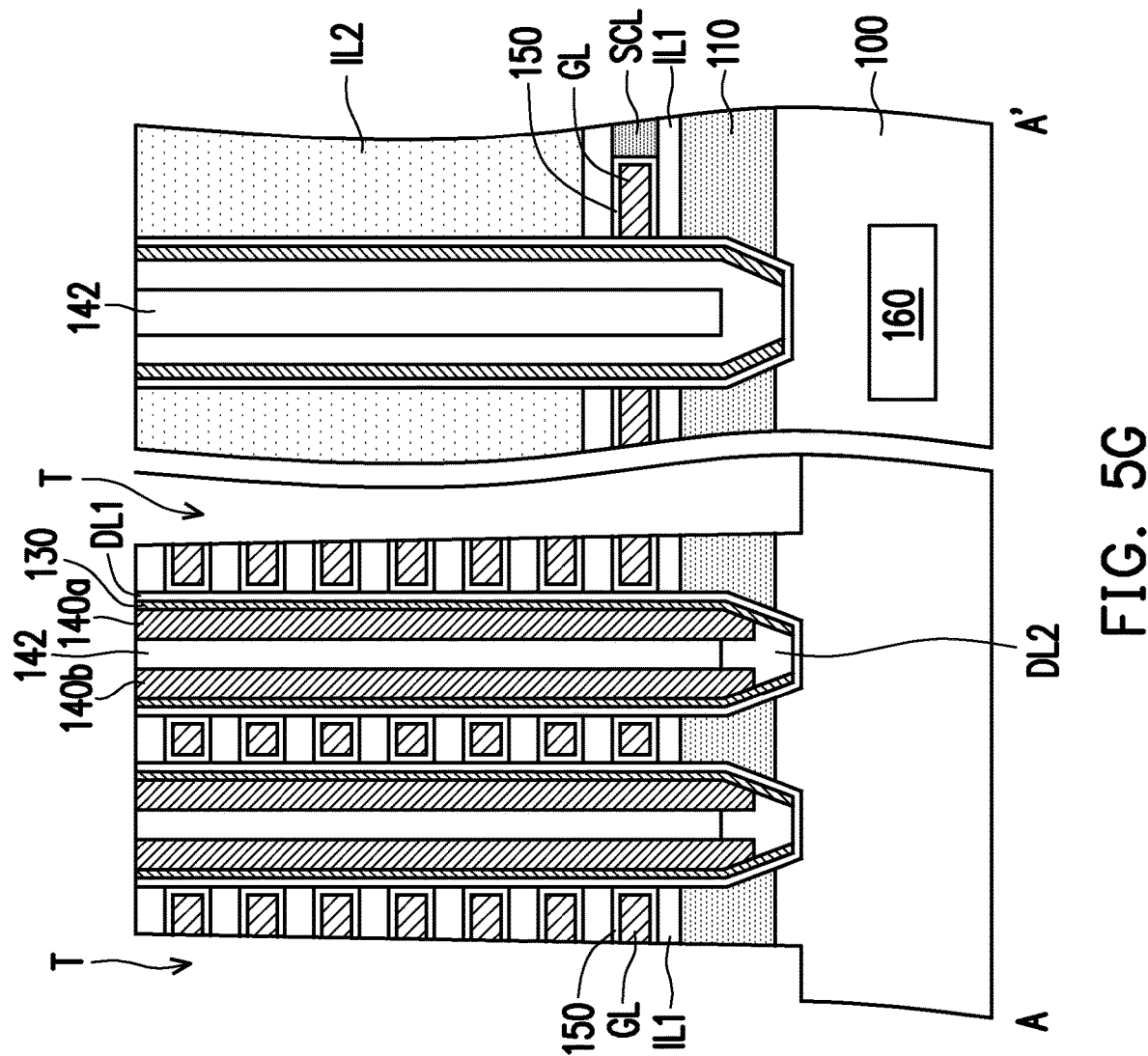

Referring to FIG. 5F and FIG. 5G, charge storage structures 150 and gate layers GL are sequentially formed in the horizontal openings SCLH. The charge storage structure 150 may be disposed between the gate layer GL and the corresponding channel pillar 130. In some embodiments, the charge storage structure 150 may be an oxide-nitride-oxide (ONO) composite layer. Under the circumstance where the dielectric layer DL1 can be used as an oxide layer adjacent to the channel in the ONO composite layer, a nitride layer and an oxide layer adjacent to the gate layer GL can be formed sequentially in the horizontal opening SCLH, so as to form the charge storage structure 150 between the channel pillar 130 and the gate layer GL. In this embodiment, the nitride layer and the oxide layer adjacent to the gate layer GL in the ONO composite layer may be formed between the gate layer GL and the insulation layer IL1 In some embodiments, the charge storage structure 150 and the gate layer GL may be formed by following steps. Firstly, a charge storage material layer (not illustrated) is conformally formed on the surfaces of the horizontal openings SCLH and trenches T, wherein the charge storage material layer does not fill up the horizontal openings SCLH and central portions of the horizontal openings SCLH are retained. Then, a gate material layer (not illustrated) is formed on the charge storage material layer, wherein the gate material layer fills in the central portions of the horizontal openings SCLH and forms on the surface of the trenches T. After that, the charge storage material layer and the gate material layer on the surfaces of the trenches T are removed by a process such as an anisotropic etch back, so as to form the charge storage structures 150 and the gate layers GL in the horizontal openings SCLH.

Figure 5H:
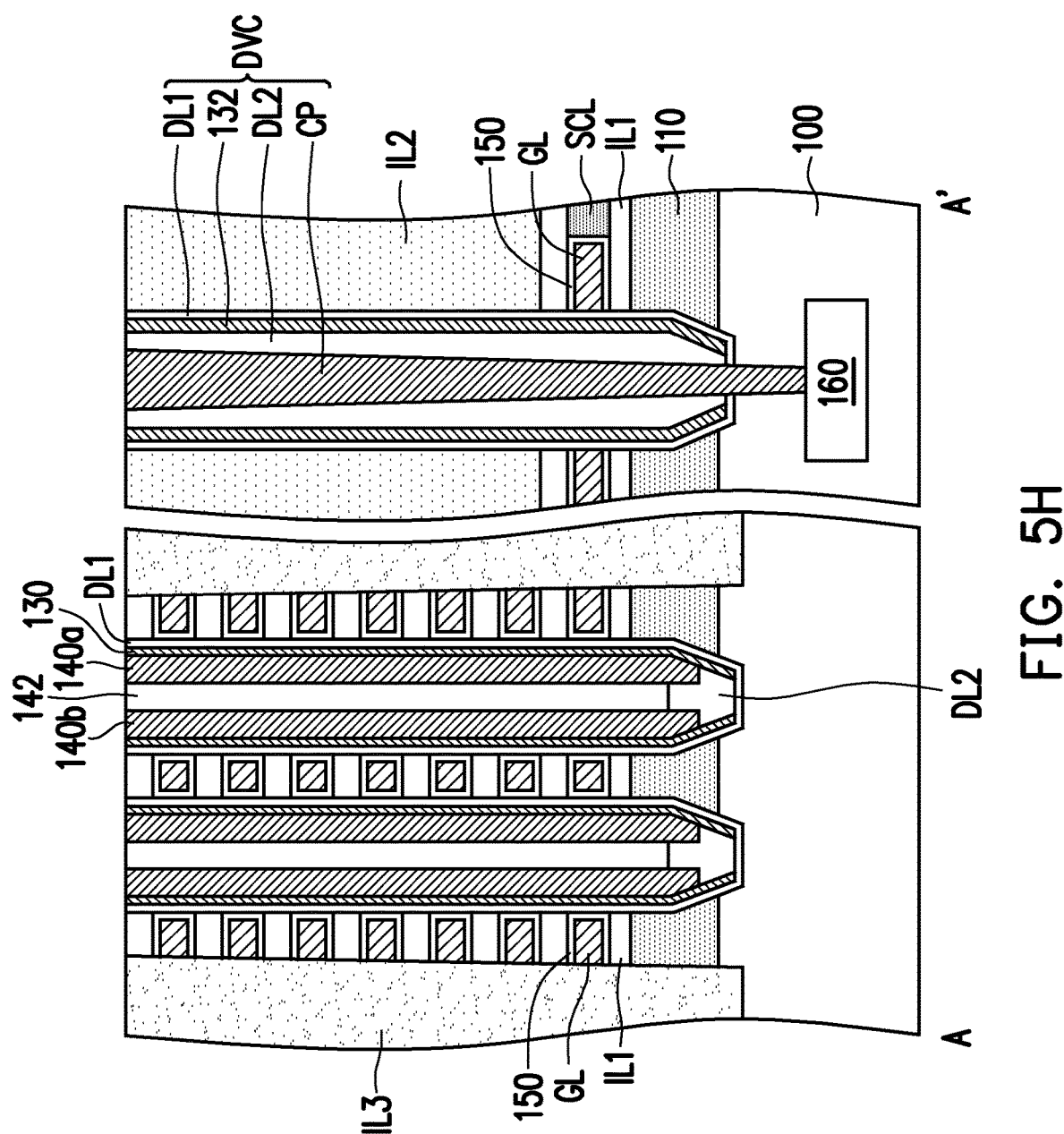

Referring to FIG. 5G and FIG. 5H, insulation layers IL3 are formed by filling the trenches T with an insulation material. The insulation layers IL3 may fill up the trenches. That is, the insulation layer IL3 may be located between the two adjacent gate stacked structures 120 and/or between the gate stacked structure 120 and the dummy gate stacked structure DGS.

Referring to FIG. 5H, the insulation pillars 142 in the channel pillars 132 may be removed and the conductive pillars CP may be formed to penetrate through the dummy gate stacked structures DGS and the conductive layers 110 and extend into the substrate 100. As such, dummy channel pillars DVC may be formed to include the conductive pillars CP, the dielectric layers DL1 and DL2, and the channel pillars 132. The conductive pillars CP may be connected with the interconnection structure (not illustrated) in the substrate 100, so as to connect the driver 160 located in the substrate 100. That is, under the circumstance where the driver 160 is located in the substrate 100, the dummy channel pillars DVC may connect signals of the gate lines GP of the conductive layers 110 to the driver 160 in the substrate 100.

Hereinafter, a method for manufacturing the three-dimensional memory device will be illustrated by using FIGS. 6A to 6H, but the method for manufacturing the three-dimensional memory device of the present invention is not limited thereto. In addition, the same or similar components are represented by the same or similar reference numerals, and will not be repeated here.

FIG. 6A to FIG. 6H illustrate a manufacturing process of a three-dimensional memory device according to an embodiment of the present invention, wherein FIG. 6A to FIG. 6H are schematic cross-sectional views taken along from line B-B' of FIG. 1.

Figure 6A:
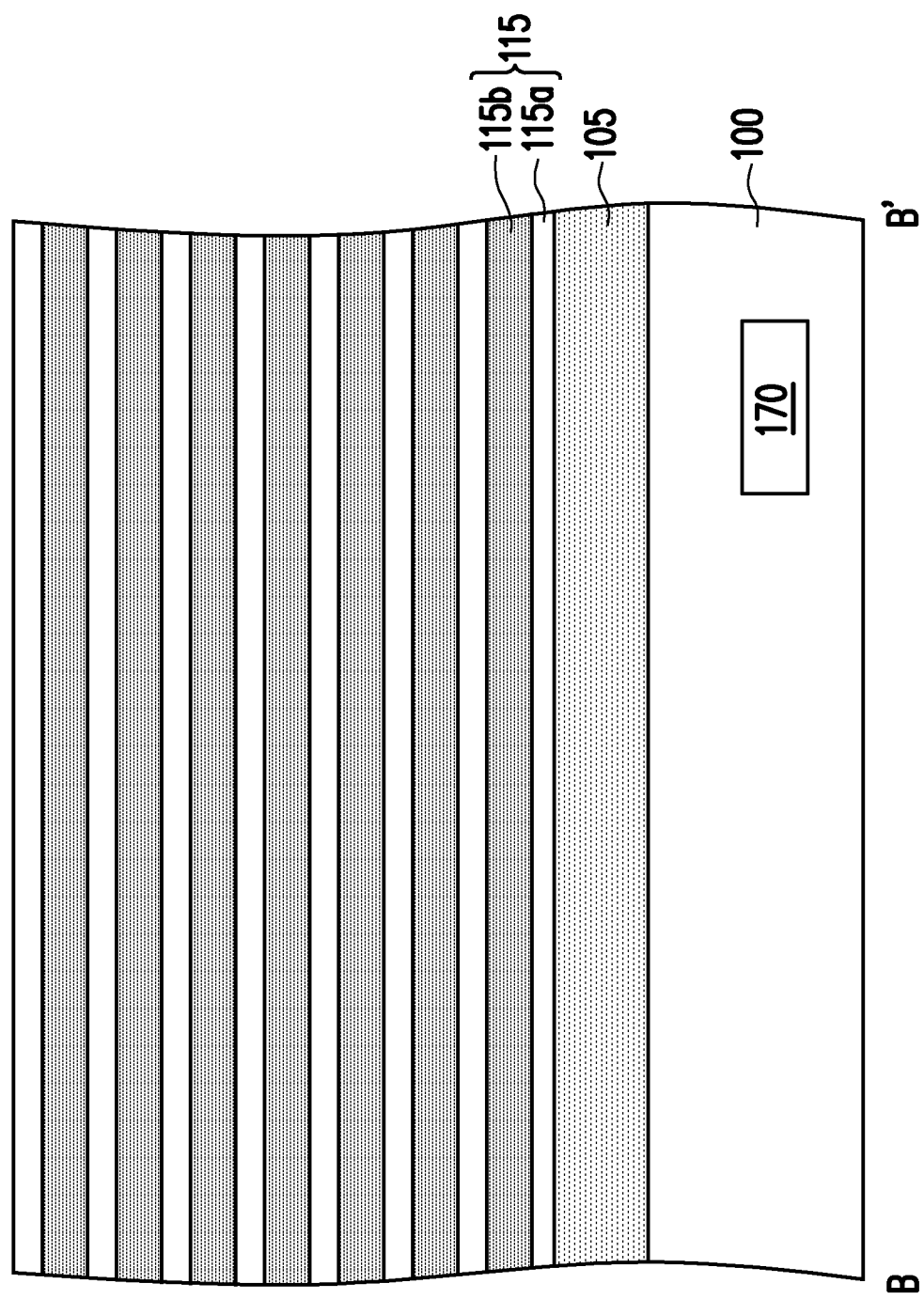

Referring to FIG. 6A, a conductive material layer 105 is formed on a substrate 100. In some embodiments, an active device 170 may be disposed in the substrate 100. Next, a staircase-like stacked structure 115 is formed on the conductive material layer 105. In some embodiments, the stacked structure 115 may include a plurality of insulation material layers 115a and a plurality of sacrificed material layers 115b alternatively stacked on the conductive material layer 105.

Figure 6B:
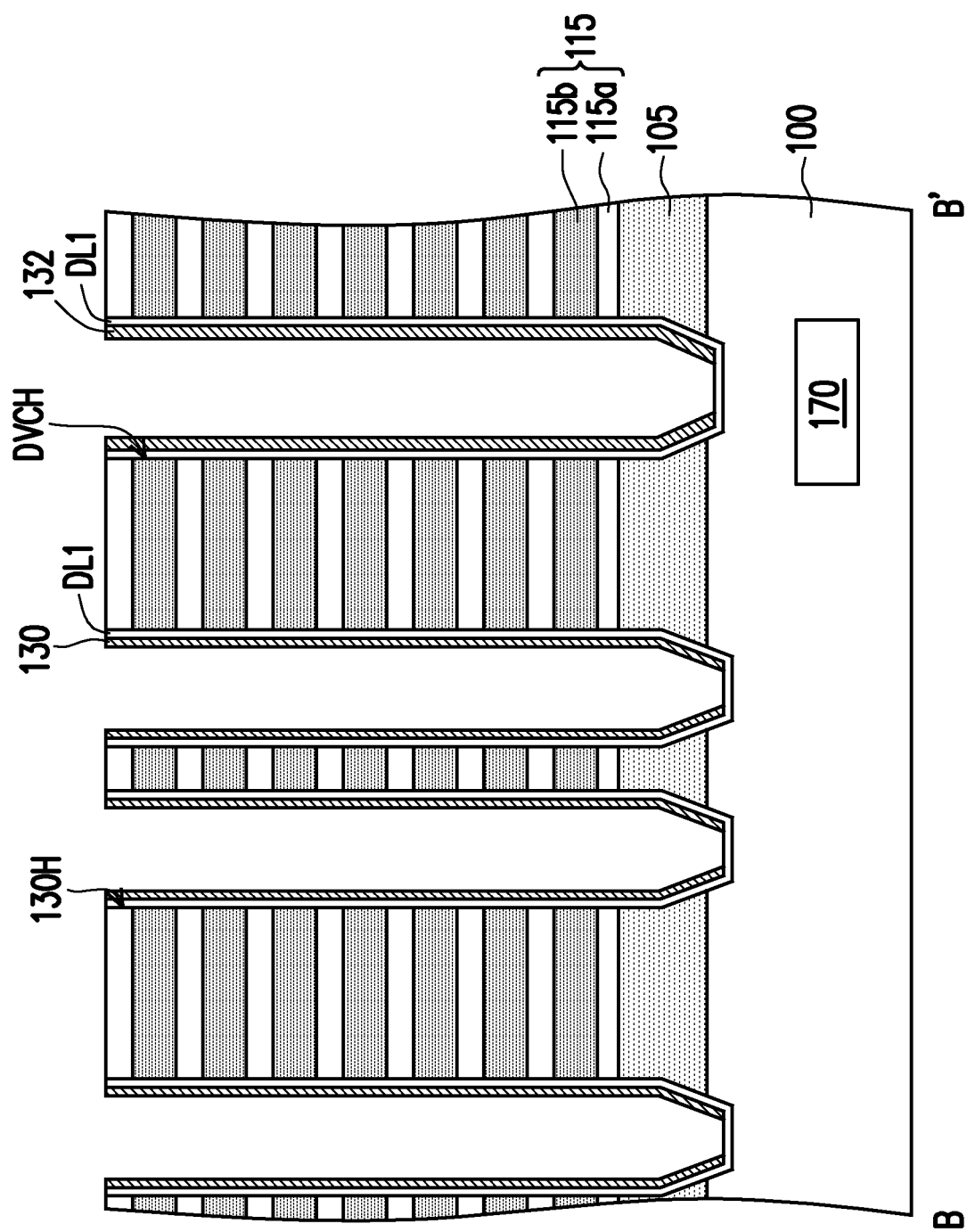

Referring to FIG. 6A and FIG. 6B, channel pillar openings 130H and dummy channel pillar openings DVCH are formed in the stacked structure 115. Next, dielectric layers DL1 and channel material layers (not shown) are sequentially formed on the sidewalls and the bottom of the channel pillar openings 130H and the dummy channel pillar openings DVCH. Then, the channel material layers at the bottom of the channel pillar openings 130H and the dummy channel pillar openings DVCH can be removed by etch back, so as to form channel pillars 130 and channel pillars 132.

Figure 6C:
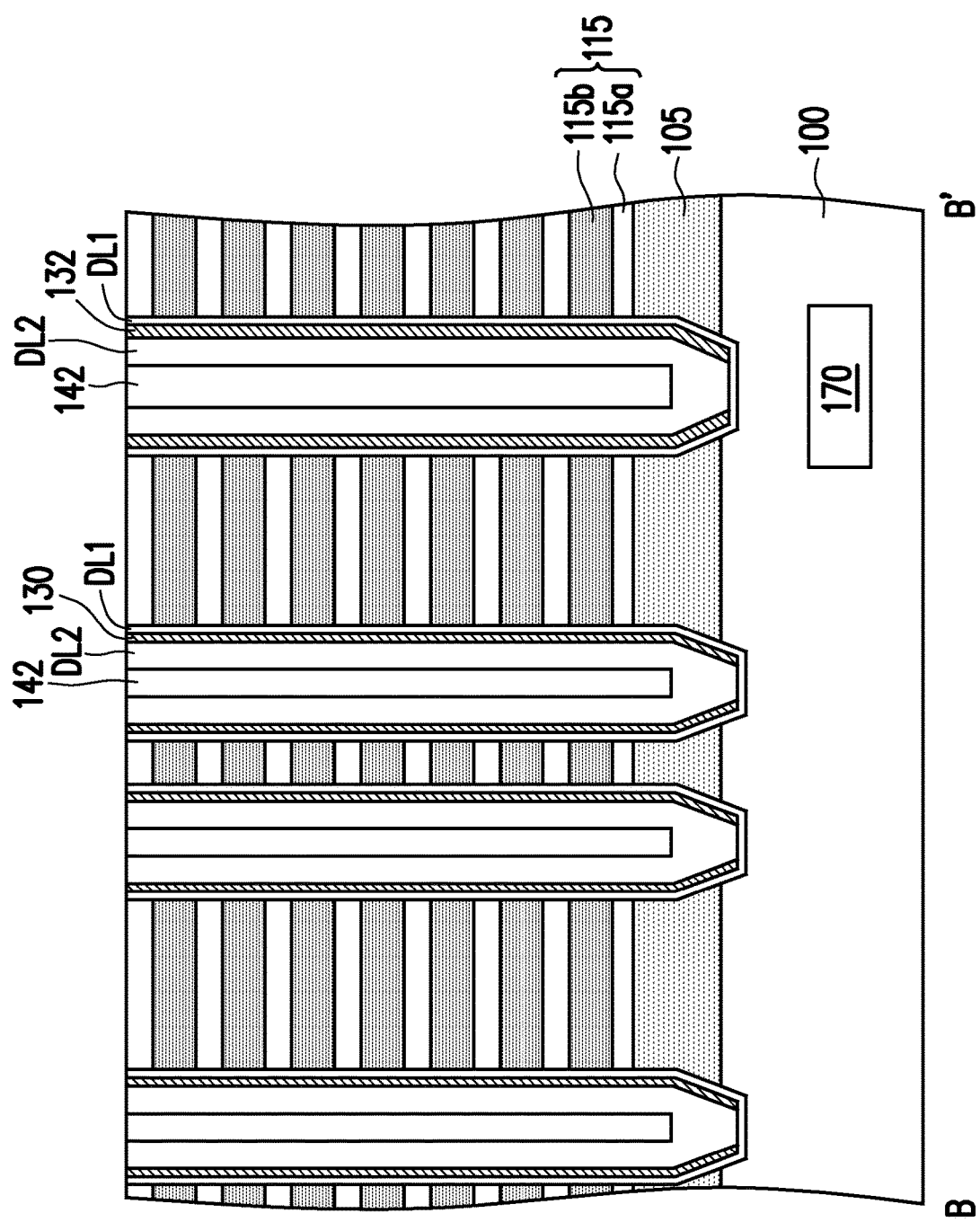

Referring to FIG. 6B and FIG. 6C, dielectric layers DL2 are formed on the sidewalls of the channel pillars 130 and 132 and on the dielectric layers DL1 exposed by the channel pillars 130 and 132, wherein the dielectric layers DL2 do not fill up the channel pillar openings 130H and the dummy channel pillar openings DVCH, and the central portions of the channel pillar openings 130H and the dummy channel pillar openings DVCH are retained. After that, an insulation material is filled in the central portions of the channel pillar openings 130H and the dummy channel pillar openings DVCH to form insulation pillars 142.

Figure 6D:
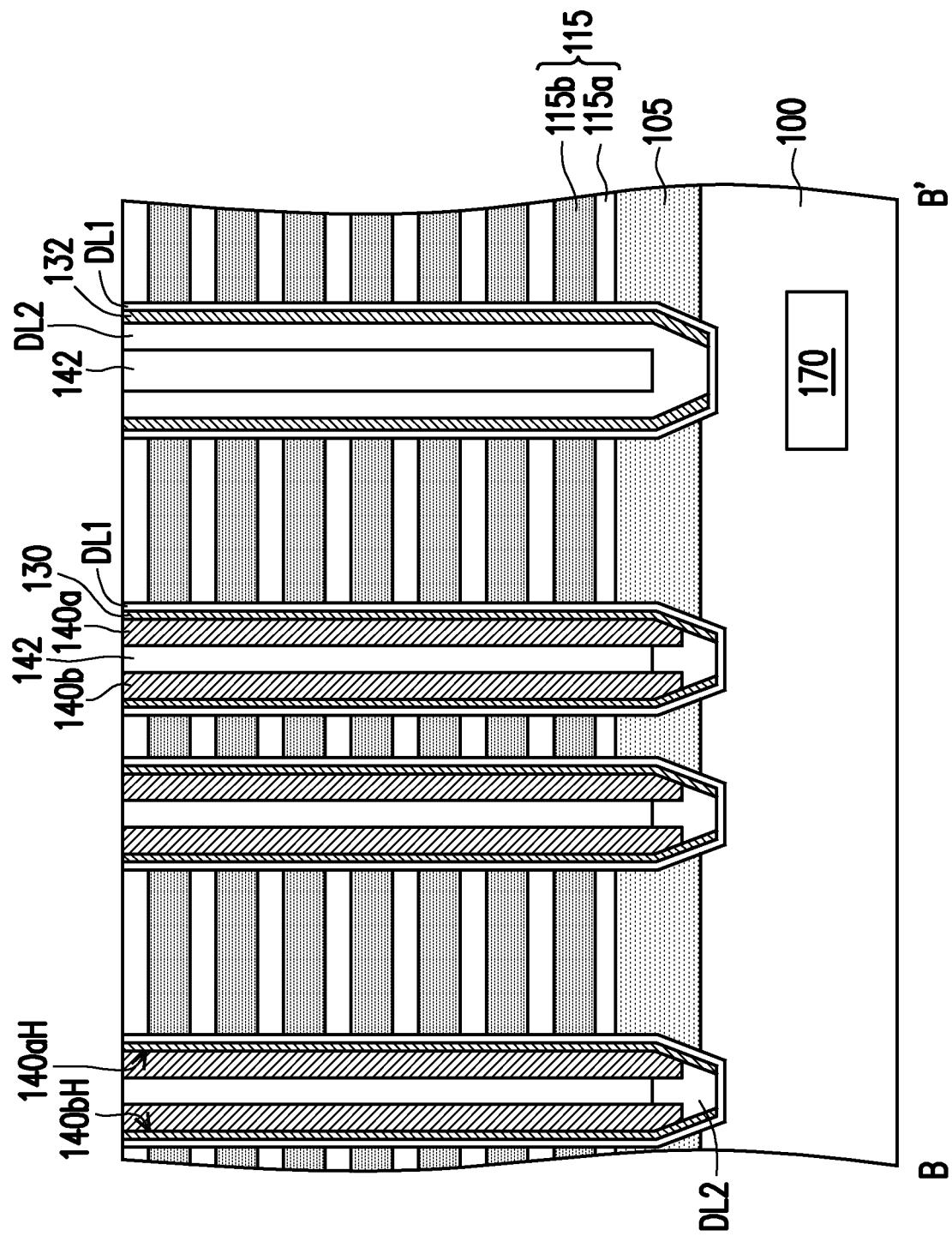

Referring to FIG. 6C and FIG. 6D, source/drain pillar openings 140aH and 140bH are formed in the dielectric layer DL2 at opposite sides of the insulation pillar 142 in the channel pillar 130. Then, the source/drain pillar openings 140aH and 140bH are filled with a material such as doped polysilicon to form source/drain pillars 140a and 140b. Each of the channel pillars 130 may be configured with two source/drain pillars 140a and 140b disposed therein.

Figure 6E:
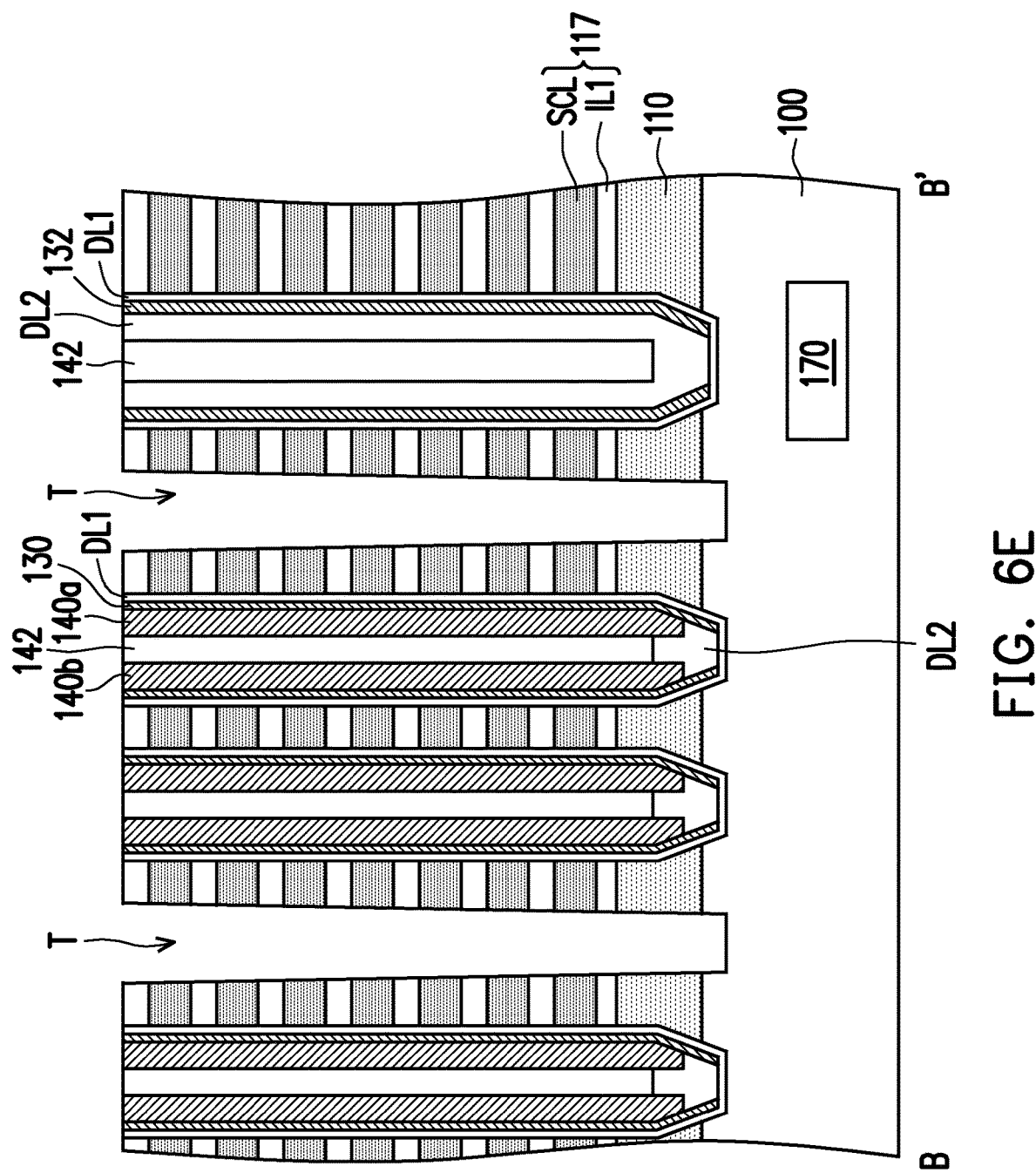

Referring to FIG. 6D and FIG. 6E, a patterning process is performed on the stacked structure 115 and a conductive material layer 105, so as to form a plurality of trenches T penetrating through the stacked structure 115 and the conductive material layer 105. The trenches T may divide the stacked structure 115 and the conductive material layer 105 into a plurality of patterned stacked structures 117 and a plurality of conductive layer 110, so as to define a plurality of tiles (e.g., tiles T1-T4 shown in FIG. 1) and a plurality of blocks (e.g., blocks B1-B4 shown in FIG. 1) in each of the tiles and to isolate the at least one of conductive layers 110 from the other conductive layers 110. Each of the patterned stacked structures 117 may include a plurality of insulation layer IL1 and a plurality of sacrificed layer SCL alternatively stacked on the substrate 100. The conductive layer 110 may be located between the substrate 100 and the plurality of patterned stacked structures 117.

Figure 6F:
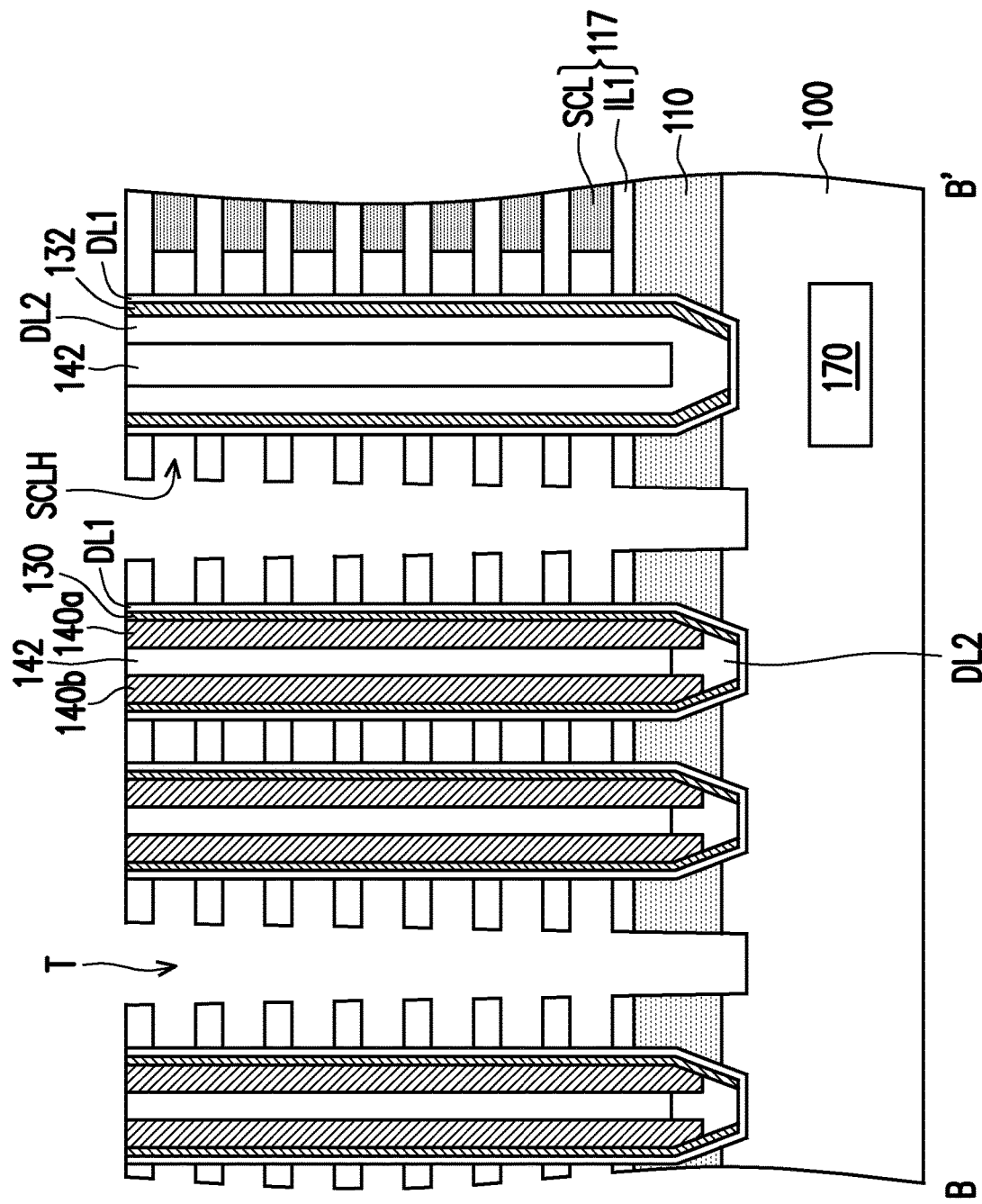

Referring to FIG. 6E and FIG. 6F, the sacrificed layer SCL in the patterned stacked structures 117 may be removed, so as to form horizontal openings SCLH between the adjacent two insulation layers IL1. In some embodiments, the trenches T may be connected with the horizontal openings SCLH. In some embodiments, the sacrificed layer SCL may be removed by a hot phosphoric acid. It should be noticed that, the area of the sacrificed layers SCL removed by the hot phosphoric acid is limited, that is, the sacrificed layers SCL adjacent to the trenches T will be removed, but the sacrificed layers SCL far away from the trenches T will be retained. For example, as shown in FIG. 1, the patterned stacked structure 117 with unremoved sacrificed layers SCL is provided between the dummy gate stacked structure DGS at one side of the tile T1 and the dummy gate stacked structure DGS at another side of the tile T3. In other words, the dummy gate stacked structures DGS may be disposed at one side of the patterned stack structures 117 where the sacrificed layers SCL are not removed.

Figure 6G:
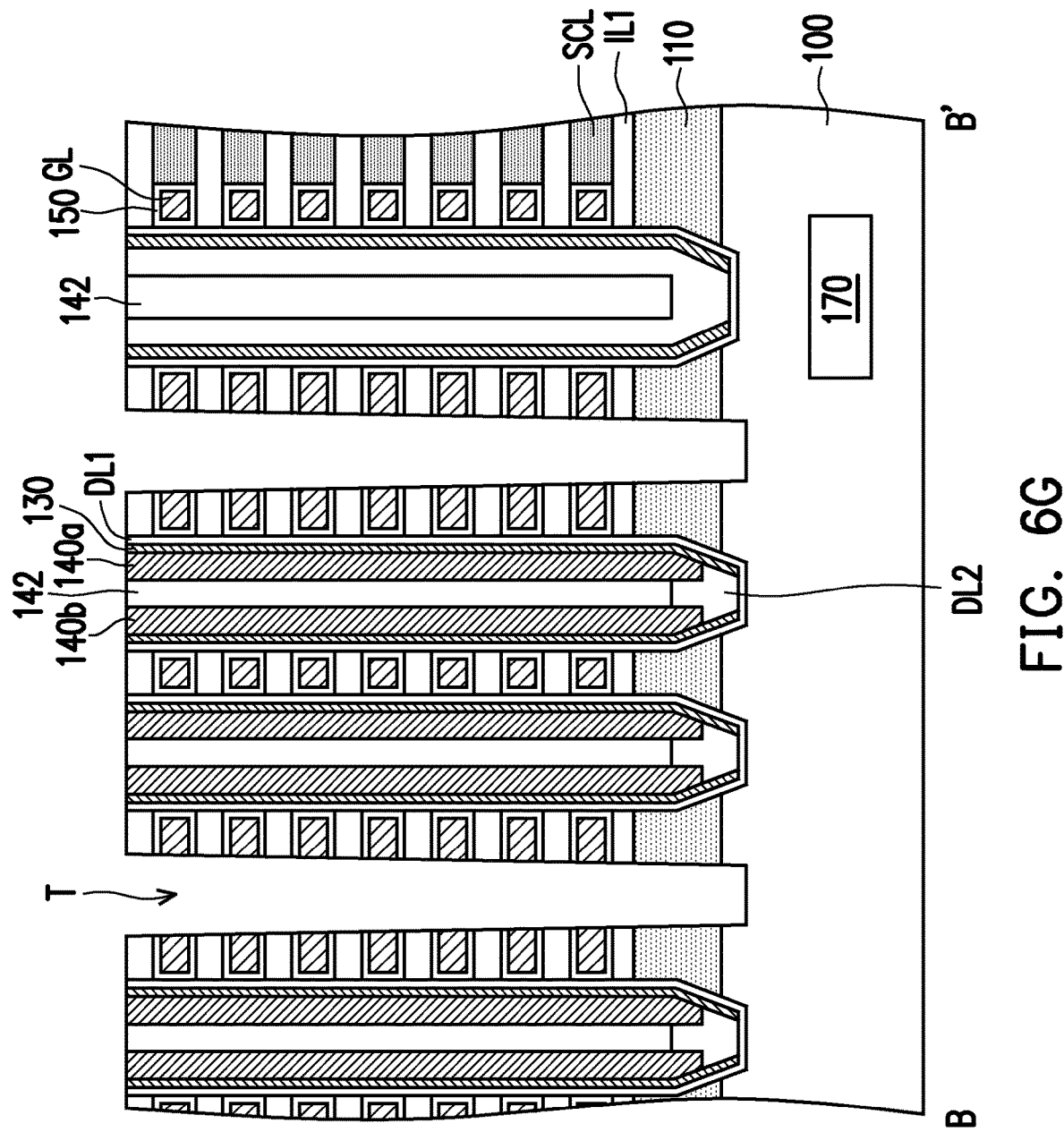

Referring to FIG. 6F and FIG. 6G, charge storage structures 150 and gate layers GL are sequentially formed in the horizontal openings SCLH. The charge storage structure 150 may be disposed between the gate layer GL and the corresponding channel pillar 130. In some embodiments, the charge storage structure 150 and the gate layer GL may be formed by following steps. Firstly, a charge storage material layer (not illustrated) is formed on the surfaces of the horizontal openings SCLH and trenches T conformally, wherein the charge storage material layer does not fill up the horizontal openings SCLH and central portions of the horizontal openings SCLH are retained. Then, a gate material layer (not illustrated) is formed on the charge storage material layer, wherein the gate material layer fills in the central portions of the horizontal openings SCLH and forms on the surface of the trenches T. After that, the charge storage material layer and the gate material layer on the surfaces of the trenches T are removed by a process such as an anisotropic etch back, so as to form the charge storage structures 150 and the gate layers GL in the horizontal openings SCLH. In some embodiments, the charge storage structure 150 may be an oxide-nitride-oxide (ONO) composite layer. Under the circumstance where the dielectric layer DL1 can be used as an oxide layer adjacent to the channel in the ONO composite layer, a nitride layer and an oxide layer adjacent to the gate layer GL can be formed sequentially in the horizontal opening SCLH, so as to form the charge storage structure 150 between the channel pillar 130 and the gate layer GL.

Referring to FIG. 6G and FIG. 6H, insulation layers IL3 are formed by filling the trenches T with an insulation material. The insulation layers IL3 may fill up the trenches. That is, the insulation layer IL3 may be located between the two adjacent gate stacked structures 120 and/or between the gate stacked structure 120 and the dummy gate stacked structure DGS.

Referring to FIG. 6H, the insulation pillars 142 in the channel pillars 132 may be removed and the conductive pillars CP may be formed to penetrate through the dummy gate stacked structures DGS and the conductive layers 110 and extend into the substrate 100. As such, dummy channel pillars DVC may be formed to include the conductive pillars CP, the dielectric layers DL1 and DL2, and the channel pillars 132. The conductive pillars CP may be connected with the interconnection structure (not illustrated) in the substrate 100, so as to connect the active device 170 located in the substrate 100. That is, under the circumstance where the active device 170 is located in the substrate 100, the dummy channel pillars DVC may connect signals of word lines WL and/or bit lines BL to the active device 170 in the substrate 100.

Based on the above, under the circumstance where the driver 160 and/or active device 170 are provided in the substrate 100, the dummy channel pillars DVC can be used to connect the signals of the gate lines GP of the conductive layers 110 and/or the signals of the word lines WL and the bit lines BL to the driver 160 and/or the active device 170 in the substrate 100. In some embodiments, the dummy channel pillars DVC may be provided in the staircase region SR of the gate stacked structure 120 and may be electrically connected to the gate layers GL respectively. As such, the dummy channel pillars DVC may connect the signals of the word lines WL to the active device 170 in the substrate 100. In some other embodiments, the dummy channel pillar DVC may also be provided in the cell region CR of the dummy gate stacked structure DGS and may be electrically connected to the source/drain pillars 140a and 140b respectively. As such, the signals of the bit lines BL or the source lines SL can be connected to the active device 170 in the substrate 100. In other embodiments, the dummy channel pillars DVC may also be provided in the staircase region SR of the dummy gate stacked structure DGS and may be electrically connected to the conductive layers 110, so that the signals of the gate lines GP of the conductive layers 110 can be connected to the driver 160 in the substrate 100.

In summary, in the three-dimensional memory device of the present invention, the conductive layer in one of the tiles is isolated from the conductive layers in the other tiles. As such, when a bias is applied on one of the conductive layers, the capacitances generated between other conductive layers and the corresponding gate layers in the other tiles can be omitted and thus the bias applied to the conductive layer can be well controlled.

Although the invention has been described with reference to the above embodiments, the embodiments are not intended to limit the invention. A person of ordinary skill in the art may make variations and improvements without departing from the spirit and scope of the invention. Therefore, the protection scope of the invention should be subject to the appended claims.

What is claimed is:

1. A three-dimensional memory device comprises a plurality of tiles, and each of the plurality of tiles comprise a plurality of blocks, and each of the plurality of blocks comprising:
   a gate stacked structure disposed on a substrate and comprising a plurality of gate electrode layers insulated from each other;
   a conductive layer disposed between the substrate and the gate stacked structure;
   a plurality of first ring-shaped channel pillars disposed on the substrate and located in the gate stacked structure;
   a plurality of source/drain pillars disposed on the substrate, and each of the plurality of first ring-shaped channel pillars is configured with two source/drain pillars disposed therein; and
   a plurality of charge storage structures, each of the plurality of charge storage structures disposed between the corresponding gate electrode layer and the corresponding first ring-shaped channel pillar,
   wherein the conductive layer in one of the plurality of tiles is isolated from the conductive layer in another one of the plurality of tiles, and
   wherein the plurality of source/drain pillars extend into the conductive layers, so that portions of the plurality of source/drain pillars are embedded within the conductive layers.

2. The three-dimensional memory device of claim 1, wherein the conductive layers in two adjacent tiles are spaced apart from each other.

3. The three-dimensional memory device of claim 2, wherein the conductive layers of the plurality of blocks within the tile are spaced apart from each other.

4. The three-dimensional memory device of claim 3, wherein the conductive layers of the plurality of blocks within the tile are electrically connected with each other.

5. The three-dimensional memory device of claim 2, wherein the conductive layers of the plurality of the blocks within the tiles are integrally connected together.

6. The three-dimensional memory device of claim 1, further comprising:

a plurality of dummy gate stacked structures disposed on the substrate and respectively configured at two opposite sides of each tiles in an arrangement direction of the plurality of blocks.

7. The three-dimensional memory device of claim 6, further comprising:
a plurality of dummy channel pillars respectively disposed in the corresponding dummy gate stacked structure and extended into the substrate, wherein each of the plurality of dummy channel pillars comprises a second ring-shaped channel pillar and a conductive pillar located in the second ring-shaped channel pillar, and at least one of the conductive layers are connected to a driver located in the substrate through the corresponding conductive pillar.

8. The three-dimensional memory device of claim 1, wherein the plurality of the first ring-shaped channel pillars extend into the conductive layers to constitute a plurality of bottom parasitic transistors with the portion of the plurality of source/drain pillars in the conductive layers.

9. The three-dimensional memory device of claim 8, wherein the plurality of bottom parasitic transistors retain off-state.

10. The three-dimensional memory device of claim 1, further comprising:
an insulation pillar disposed between the two source/drain pillars.

* * * * *